United States Patent
Takigawa et al.

(10) Patent No.: US 7,595,498 B2
(45) Date of Patent: Sep. 29, 2009

(54) ELECTROMAGNETIC WAVE GENERATION APPARATUS AND MANUFACTURING METHOD OF ELECTROMAGNETIC WAVE GENERATION APPARATUS

(75) Inventors: Shinichi Takigawa, Ibaraki (JP); Daisuke Ueda, Ibaraki (JP)

(73) Assignee: Panasonic Corporation, Osaka (JP)

( * ) Notice: Subject to any disclaimer, the term of this patent is extended or adjusted under 35 U.S.C. 154(b) by 233 days.

(21) Appl. No.: 11/195,812

(22) Filed: Aug. 3, 2005

(65) Prior Publication Data
US 2006/0028110 A1 Feb. 9, 2006

(30) Foreign Application Priority Data
Aug. 5, 2004 (JP) ............... 2004-228939

(51) Int. Cl.
*H01L 29/12* (2006.01)
(52) U.S. Cl. ............... 257/10; 257/11; 438/20
(58) Field of Classification Search ............ 257/10–11; 438/20; 313/346, 373, 527, 530, 541, 542
See application file for complete search history.

(56) References Cited

U.S. PATENT DOCUMENTS

| 1,955,608 | A | * | 4/1934 | Rentschler | ............ 313/539 |
| 1,965,849 | A | * | 7/1934 | McLlvaine | ............ 313/1 |
| 2004/0207032 | A1 | * | 10/2004 | Edamura et al. | ............ 257/414 |

FOREIGN PATENT DOCUMENTS

| JP | 4-296430 | | 10/1992 |
| JP | 2004-022766 | | 1/2004 |
| JP | 2004022766 A | * | 1/2004 |
| WO | WO 02060017 | * | 8/2002 |

OTHER PUBLICATIONS

"Oblique" The Free Online Dictionary. 2008, http://www.thefreedictionary.com (Jun. 16, 2008).*
"Cross section" The Free Online Dictionary. 2008, http://www.thefreedictionary.com (Jun. 16, 2008).*
English Language Abstract of JP 2004-022766.
English Language Abstract of JP 4-296430.
Tani et al., "Emission Characteristics of Photoconductive Antennas based on Low-Temperature-Grown GaAs and Semi-Insulating GaAs," Applied Optics, vol. 36, No. 30, pp. 7853-7859 (1997).
"Providing a Carbon Nanotube Alligned Menbranes", Carbon Nanotube, Kagakudojin, Jan. 30, 2001, pp. 89-95, together with an English language translation of the same.

(Continued)

*Primary Examiner*—Thanh V Pham
*Assistant Examiner*—Jami M Valentine
(74) *Attorney, Agent, or Firm*—Greenblum & Bernstein P.L.C.

(57) ABSTRACT

The present invention provides an electromagnetic wave generation apparatus that is compact and generates a high power terahertz wave. An electromagnetic wave generation apparatus includes: a substrate; a first electrode, having a photoelectron emitting part, formed on one of the surfaces of the substrate; a second electrode formed on the surface of the substrate; a power supply source that applies voltage to between the first electrode and the second electrode so that the potential of the second electrode becomes higher than the potential of the first electrode; and a light source that radiates one of time modulated light and wavelength modulated light, and in the apparatus, the photoelectron emitting part (a) emits electrons when light is irradiated and (b) is placed at a position which an incident light from the light source enters and from which the emitted electrons run to the electron incidence plane of the second electrode.

6 Claims, 18 Drawing Sheets

OTHER PUBLICATIONS

Hamada et al., "Electron Devices", Corona Publishing Co., ltd., pp. 156-158 (1957), together with an English language translation of the same.

Nemanich et al., "Electron Emission Properties of Crystalline Diamond and III-Nitride Surfaces," Applied Surface Science 130-132, pp. 694-703 (1998).

* cited by examiner

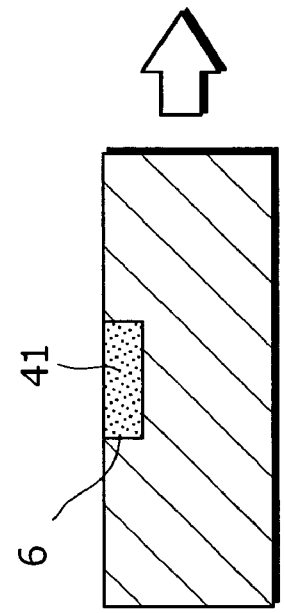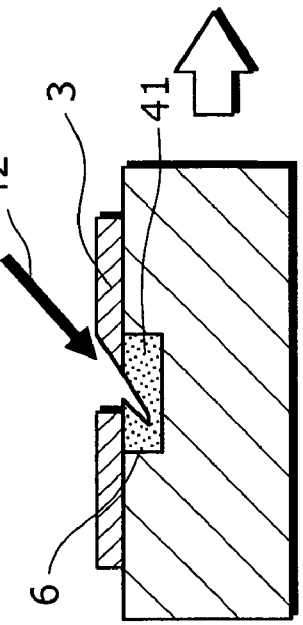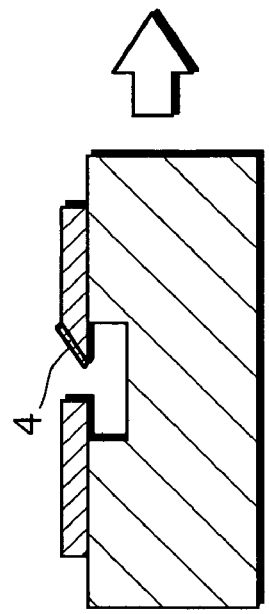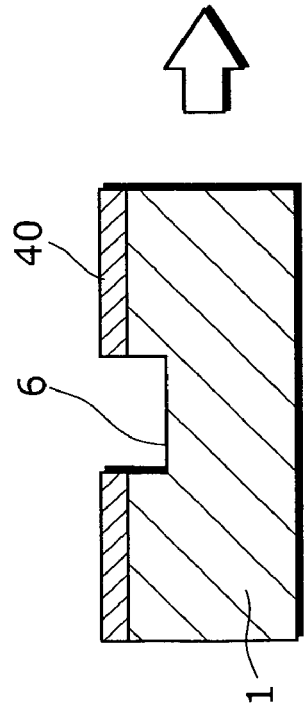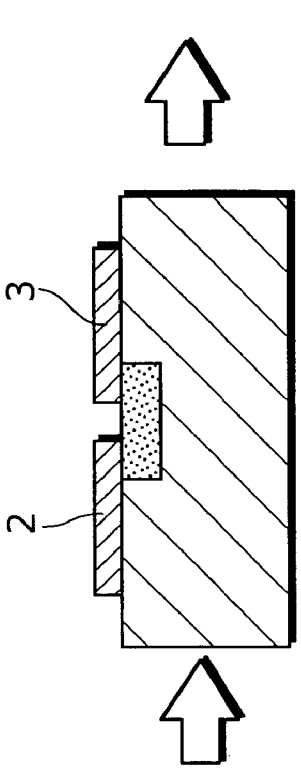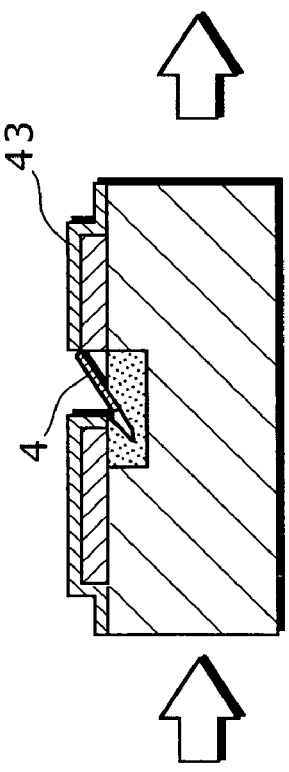

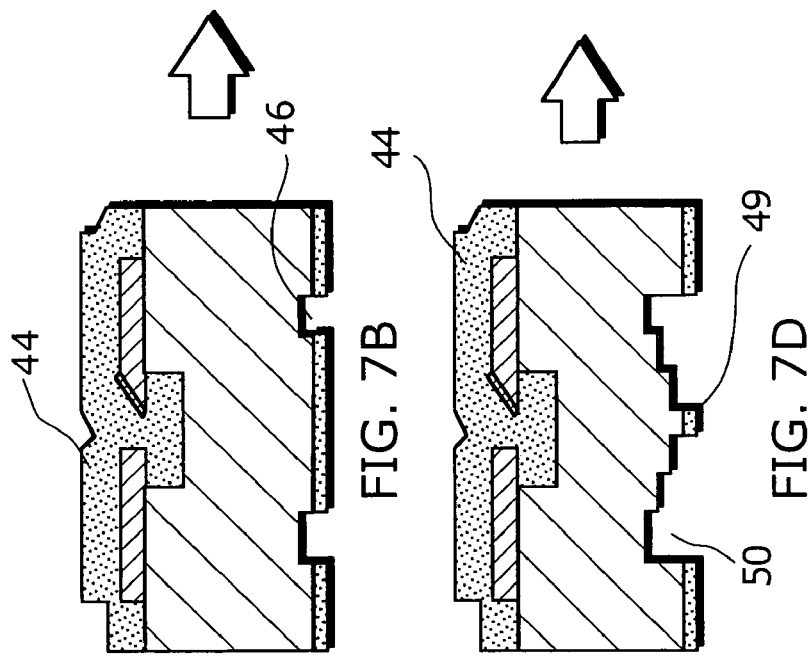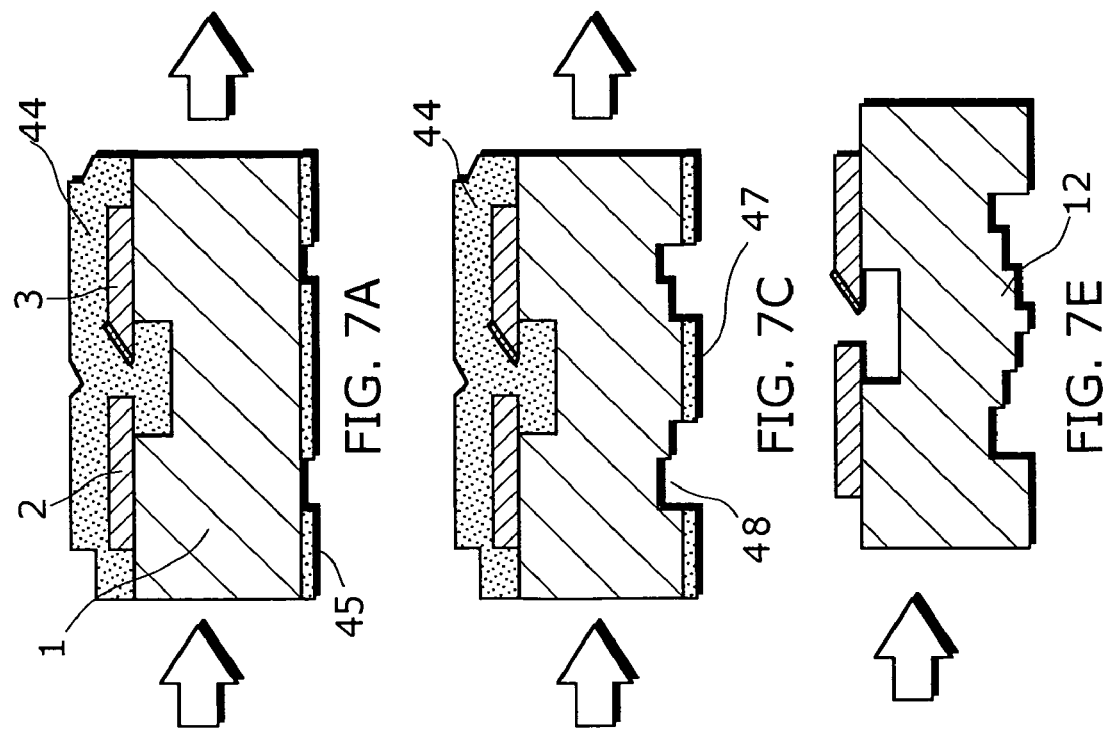

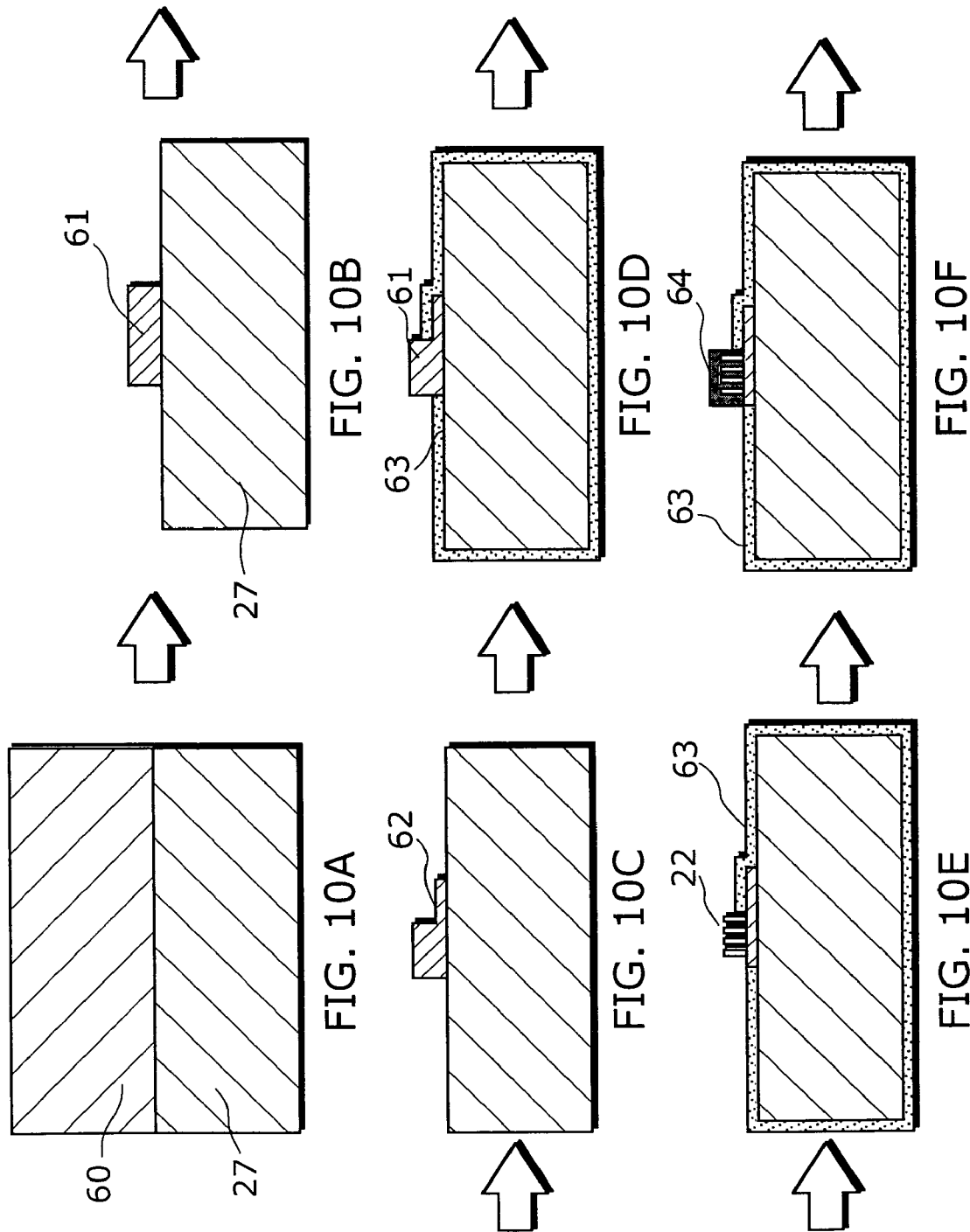

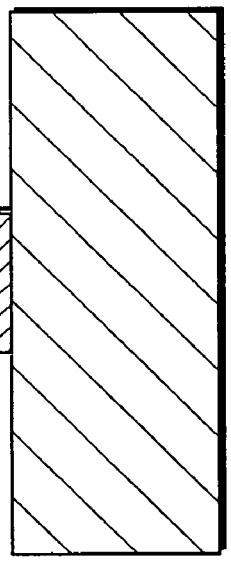
FIG. 14A
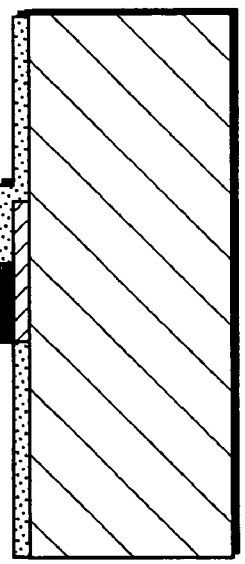
FIG. 14B
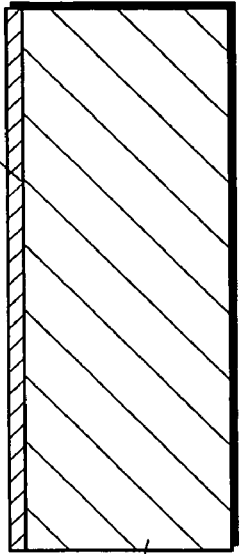
FIG. 14C
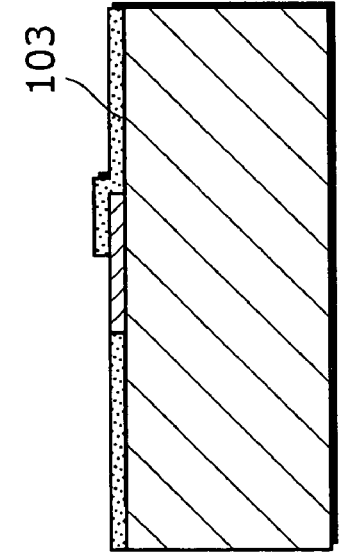
FIG. 14D

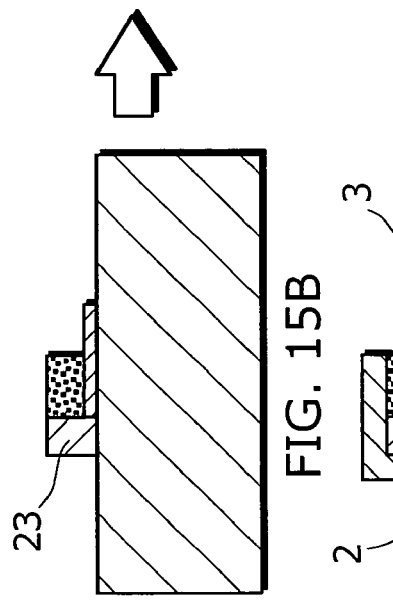
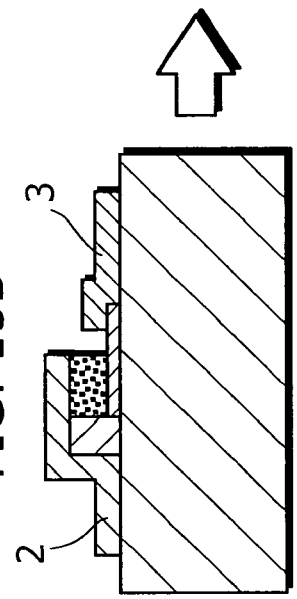
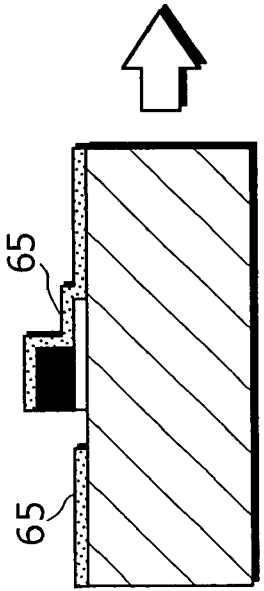
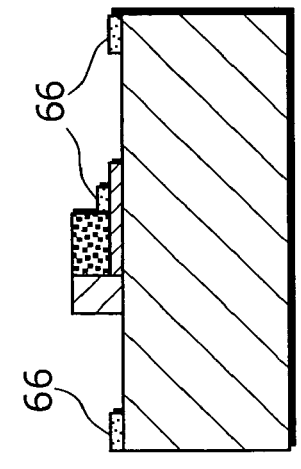
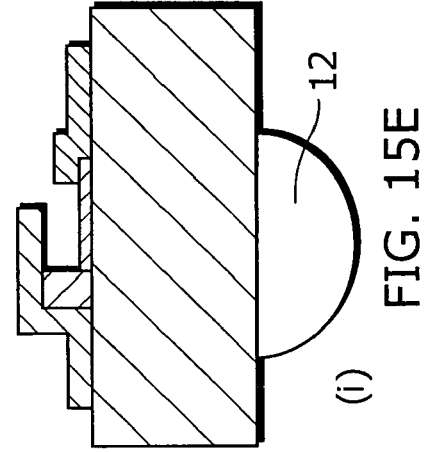

ELECTROMAGNETIC WAVE GENERATION APPARATUS AND MANUFACTURING METHOD OF ELECTROMAGNETIC WAVE GENERATION APPARATUS

BACKGROUND OF THE INVENTION (1) Field of the Invention

The present invention relates to a generation technique of a terahertz (THz) electromagnetic wave.

(2) Description of the Related Art

Electromagnetic waves which have a frequency ranging from 0.1 THz to 10 THz (in the terahertz region) belong to a boundary between light and electric waves. They have the following characteristics: transmitability which is a characteristic of electric waves; and telecentricity which is a characteristic of light. Also, an electromagnetic wave in such region (called "terahertz wave" hereinafter) has a number of absorption spectrums each of which is unique to a substance. Therefore, it is expected that terahertz waves are used in a number of industrial fields such as medical applications, environmental measurements and engineering applications. They include especially: an inspection of an object in an envelop; a food inspection; an inspection of personal belongings; a drug analysis; a medical checkup for skin cancer; a measurement of the quantity of semiconductor impurities; and a complex dielectric constant evaluation. Thus recent years have seen active research and development about terahertz waves.

A widely used generation method of a terahertz wave is the method using a photoconductive element. A conventional example will be described below with reference to FIG. 1 (refer to Reference Document 1: pp. 7853 to 7859 of "Emission characteristics of photoconductive antennas based on low-temperature-grown GaAs and semi-insulating GaAs", Applied Optics, vol. 36, No. 30, (1997), M. Tani et. Al.). A low-temperature-grown GaAs layer 92 is formed on a semi-insulating GaAs substrate 91 using the molecular beam epitaxial method. It is known that the GaAs layer 92 has a picosecond carrier lifetime that is $10^{-12}$ sec or less maintaining a comparatively large carrier mobility when the layer is formed under a low temperature. This is why the layer is useful as a film for terahertz waves having a high-speed photoconductiveness. On the surface of the GaAs layer 92 a positive electrode 2 and a negative electrode 3 are formed. Both the positive and negative electrodes constitute a dipole antenna that is easy to radiate terahertz waves. Each of these electrodes is T-shaped, and the smallest gap between these electrodes is 5 μm. A power supply 5 applies approximately 30 V to between the positive electrode 2 and the negative electrode 3. A femtosecond pulse light 8 is radiated from a laser radiation exit 7 to the gap on the GaAs layer 92. The pulse light 8 is an approximately 80 fsec Ti:sapphire laser having a wavelength of approximately 780 nm, the laser having been mode-locked by Argon laser excitation. This generates electrons on the photoconductive film (low-temperature-grown GaAs layer 92). The generated electrons become a picosecond order single pulse current, and flow between both the electrodes. This causes a dipole antenna to radiate terahertz wave 10 toward the direction of the substrate 91. These spectrums of the radiation light ranges from a direct current to a frequency of terahertz, and thus electromagnetic waves having a wide band that covers up to a terahertz wave can be obtained.

In order to make terahertz wave power bigger, it is desirable that the bias voltage between the positive electrode 2 and the negative electrode 3 be high.

However, the Reference Document 2 (Japanese Laid-Open Patent Application NO. 2004-22766 publication) describes the following problem. When high voltage is applied to between both the electrodes for a long time, thermally excited carriers increase the amount of current that flows between both the electrodes resulting in decreasing the generation efficiency of terahertz waves. A countermeasure described in the Reference Document 2 is to prevent temperature increase and to control thermal excitation by using forced cooling.

Also, the Reference Document 3 (Japanese Laid-Open Patent Application No. 4-296430 publication) describes the method for emitting an electron pulse wave by applying a pulse light to a photoelectron emitting plane and emitting terahertz wave using the electron pulse wave. This method is for emitting electromagnetic waves causing Cherenkov radiation by accelerating the electron pulse wave. This method requires a distance that enables accelerating the electron pulse wave up to light speed. This is why it is difficult to realize a terahertz wave generation source that is practical and compact.

SUMMARY OF THE INVENTION

However, the method described in the Reference Document 2 is not effective at certain environmental temperatures or in certain applications. In addition, the method requires a terahertz wave generation apparatus having a cooler, and thus the size of such apparatus becomes inevitably big because of the cooler. Also, even in using the apparatus for a short time, increase in voltage to be applied to between both the electrodes resulting in generation of leakage current that is conducted by hopping the surface level of the GaAs layer 92. This leakage current is a cause of decrease in the generation efficiency of a terahertz wave.

The present invention is conceived considering the above-described problems. An object of the present invention is to provide a compact electromagnetic wave generation apparatus that generates a high power terahertz wave and a manufacturing method of the electromagnetic wave generation apparatus.

In order to achieve the object, the electromagnetic wave generation apparatus, of the present invention, (a) has a photoelectron emitting electrode and a counter electrode, (b) generates electrons by irradiating one of time modulated light and wavelength modulated light onto the photoelectron emitting electrode, and (c) generates an electromagnetic wave by guiding the generated electrons towards the counter electrode, and in the apparatus, a path through which the electrons run to the counter electrode is under vacuum.

Also, the electromagnetic wave generation apparatus, of the present invention, includes: a substrate; a first electrode, having a photoelectron emitting part, formed on one of surfaces of the substrate; a second electrode formed on the surface of the substrate; a power supply source that applies voltage to between the first electrode and the second electrode so that a potential of the second electrode becomes higher than a potential of the first electrode; and a light source that radiates one of time modulated light and wavelength modulated light, and in the apparatus, the photoelectron emitting part (a) emits electrons when light is radiated and (b) is placed at a position which an incident light from the light source enters and from which the emitted electrons run to an electron incidence plane of the second electrode.

The electromagnetic generation apparatus of the present invention is used under vacuum. Negative voltage is applied to the first electrode having a photoelectron emitting part and positive voltage is applied to the second electrode. When a time modulated light (a short pulse light) or a wavelength modulated light is irradiated on the photoelectron emitting part, electrons are emitted. The emitted electrons are guided to the second electrode (the positive electrode) under vacuum. An induced current flows between both the electrodes until such electrons reach the positive electrode. Breakdown voltage is high under vacuum. This means that high voltage can be applied.

Also, it is desirable that the plane of the photoelectron emitting part and a counter plane of the second electrode be not parallel. In general, a photoelectron emitting plane and an electrode plane that receives electrons from the photoelectron emitting plane are parallel. In this case, the gap between the photoelectron emitting plane and the electrode plane must be sufficiently wide in order that light can reach the photoelectron emitting plane. In other words, it is difficult that light reaches the photoelectron emitting plane in the case where the gap is too narrow. However, a leaning photoelectron emitting plane makes it possible to guide an incident light towards the photoelectron emitting plane. More specifically, with the negative electrode (the first electrode) having a photoelectron emitting plane that is lean against the positive electrode (the second electrode), it becomes possible to make light irradiation easier because a light irradiation direction and an electron outgoing direction are different from each other.

Further, in a second aspect of the present invention, it is desirable that Equation of D sin θ/L≦0.1 be satisfied when θ is an angle formed by the plane of the photoelectron emitting part and a counter plane of the second electrode, L is the shortest distance between the plane of the photoelectron emitting part and the second electrode, and D is the following length of the plane of the photoelectron emitting part: the length being measured in a direction from the first electrode to the second electrode.

When the above Equation 1 is satisfied, the difference between the minimum value L and the maximum value (L+D sin θ) of travel distances of electrons that are emitted from the photoelectron emitting plane falls within ten percent of the smallest value L. This makes it possible to control the pulse width not to spread exceeding an allowable range, because the pulse width spreads depending on the difference in travel distances of electrons. This means that it is possible to improve spectrum purity of the emission.

Also, in the second aspect of the present invention, it is desirable that a concave be formed between the first electrode and the second electrode in the surface of the substrate of the electromagnetic wave generation apparatus. With this concave, it is possible to isolate both the electrodes under vacuum. Without this concave, electrons conduct in the surface level of the substrate. In other words, the concave can reduce leakage current when high voltage is applied.

Also, it is desirable that the distance between at least a part of the concave and the counterpart of the concave (for example, the width of the concave) be between 50 μm and not more than 150 μm. Under this condition, a terahertz wave (1 to 3 THz) resonates at the concave, and it becomes possible to emit a terahertz wave having a higher spectrum purity. Since the wavelength of this terahertz wave ranges from 100 to 300 μm, in the case where at least a part of the concave and the counterpart of the concave is half the wavelength of terahertz (50 to 150 μm), the terahertz wave resonates. This resonation makes it possible to improve the spectrum purity of the terahertz wave that is being radiated.

Also, in the second aspect of the present invention, it is desirable that the photoelectron emitting part be formed using carbon nano tubes in the electromagnetic wave generation apparatus. Since carbon nano tubes have extremely slim ends, the electric field is easily converged into these ends. As a result, it becomes possible to easily emit electrons generated by photon energy, and to make great amount of current flow between both the electrodes (the dipole antenna). Thus it becomes possible to realize an electromagnetic wave generation apparatus that generates a high power terahertz wave.

In this case, it is desirable that the power supply source is controlled to apply voltage so that the bias voltage, which is just below the threshold voltage of electron emission of carbon nano tubes, is applied. In this way, the effective work function becomes smaller, photoelectrons can be emitted even with a light having only a small energy, and thus it becomes possible to provide a higher flexibility in light source selection.

Also, it is desirable that the photoelectron emitting part be formed using $Al_{1-x-y}In_xGa_yN$ ($0 \leq x \leq 1, 0 \leq y \leq 1$). It is known that AlGaN and AlN each has an electron affinity that is close to a negative value (refer to Appl. Surf. Sci. 130, 694 to 703 (1998), by R. J. Nemanich, P. K. Baumann, M. C. Benjamin, O.-H. Nam, A. T. Sower. B. L. Ward, H Ade and R. F. Davis). Further, containing other III group atom In makes it possible to adjust a lattice constant and to form a photoelectron emitting plane with no strain.

In this case, it is desirable that the power supply source is controlled to apply voltage so that the bias voltage, which is just below the threshold voltage of electron emission of $Al_{1-x-y}In_xGa_yN$, is applied. In this way, the effective work function becomes smaller, photoelectrons can be emitted even with a light having only a small energy, and thus it becomes possible to provide a higher flexibility in light source selection.

Also, it is desirable that the voltage to be applied by the power supply source and the distance between the first electrode and the second electrode be determined so that the time period from the time when electrons are emitted from the photoelectron emitting part and to the time when these electrons reach the second electrode is between 0.01 psec and not more than 10 psec.

The following is known from Reference Document 3. Velocity Vd indicating the velocity at the time when electrons reach the positive electrode and time τ indicating the time period until the time when these electrons reach the second electrode are represented by the following Equation 2 and Equation 3.

$$v_d = (2 \, eV/m)^{0.5} = 5.95 \times 10^5 \times V^{0.5} \quad \text{(Equation 2)}$$

$$\tau = 2d/v_d \quad \text{(Equation 3)}$$

where, d indicates the distance between both the electrodes, V indicates the voltage applied between both the electrodes, e indicates charge of electrons, m indicates the mass of electrons, and for simplification, it is assumed that electrons are emitted from the negative electrode (the first electrode) at an initial velocity of 0 and a uniform electric field is present between the positive and negative electrodes.

The above Equations 2 and 3 can be expanded into Equation 4 shown below. Equation 4 represents time r indicating the time period until the time when the electrons emitted from the photoelectron emitting part reach the second electrode.

$$\tau = d \times \sqrt{(2 \, m/eV)} \quad \text{(Equation 4)}$$

While the electrons travel between both the electrodes, an induced current flows in the circuit including both the electrodes. As a result, the induced current keeps flowing while time r falls within the above range (between 0.01 psec and not more than 10 psec), and thus it becomes possible to extract a terahertz pulse light.

Further, it is desirable that the light source irradiate one of the following: a pulse light having a pulse width of 1 psec or less; and two lights, each of which having a difference frequency of between 0.1 THz and not more than 10 THz. With a structure that allows a pulse light having a pulse width of 1 psec or less to become conductive between both the electrodes, an electromagnetic wave having terahertz components can be radiated. Also, with the structure that allows electrons become conductive between both the electrodes using two lights having different frequencies, a terahertz wave can be generated. The terahertz wave to be radiated can be adjusted by tuning the difference frequency of the terahertz wave.

Further, it is desirable that a mirror to guide the light radiated from the light source towards the photoelectron emitting part be set on one of the surfaces of the substrate. In this way, it becomes possible to guide an incident light towards the photoelectron emitting part, and thus it becomes possible to improve the flexibility in positioning such an incident light.

Further, it is desirable that the first electrode and the second electrode be connected to an electromagnetic wave resonator. The resonator resonates a terahertz wave of, for example, between 0.1 THz and not more than 10 THz. With this structure, a terahertz wave generated from the electrodes is amplified, and thus it becomes possible to obtain a high power terahertz wave.

Also, it is desirable that the substrate be formed using silicon and an electromagnetic wave light condensing element be formed on the back surface of the earlier-selected surface of the substrate. The silicon substrate is best suited to a circuit element for a terahertz wave because it has a high thermal conductivity and because it is almost transparent in a terahertz wave band. Also, since silicon has a high refractive index, the electromagnetic wave generated in electrodes run to the substrate. Therefore, a lens structure can be integrated into the circuit, and this makes implementation of such a circuit easier.

Also, it is desirable that the electromagnetic wave light condensing element is a lens having a stairstep form and the width of the lens be between 15 μm and not more than 40 μm. The gap of the stairsteps should be made shorter than the wavelength of the electromagnetic wave that should be collected. Since a terahertz wavelength is long, it is easy to manufacture such a lens having a stairstep form. As the wavelength of the terahertz wave ranges from 100 to 300 μm, the wavelength becomes 30 to 80 μm in Si which has a refractive index of approximately 3.5. Therefore, when the width of the lens is 15 to 40 μm that is half the wavelength in Si, the lens is regarded as equivalent to a hemisphere for terahertz wave. At this time, such lens has the same light condensing effect as a hemispherical lens. Such a lens can be manufactured in a general semiconductor manufacturing process unlike the case of manufacturing a hemispherical lens.

Here, an electromagnetic wave generation apparatus may be manufactured using the following manufacturing method. The method includes the following six steps: a first step of forming a concave on one of the surfaces of the substrate; a second step of filling the concave with a protection member; a third step of forming a first electrode and a second electrode at a gap on the selected surface of the substrate so that one of the ends of each electrode is positioned above the concave into which the protection member is filled; a fourth step of cutting a part of the first electrode that faces the second electrode so as to make the part into a leaning plane; a fifth step of forming a photoelectron emitting part on the resulting leaning plane of the first electrode after performing the fourth step; and a sixth step of removing the protection member after performing the fourth step or the fifth step. Here, it is desirable that the protection member be polycrystaline GaAs.

Also, an electromagnetic wave generation apparatus may be manufactured using the following manufacturing method. The method includes the following seven steps: a first step of forming a SiC layer having a two stairstep form on one of the surfaces of the substrate; a second step of covering the substrate excluding the higher step with an aluminum nitride member; a third step of forming a photoelectron emitting part having carbon nano tubes on its higher step by heating the whole substrate at a temperature at which the Si component is removed of the SiC layer after performing the second step; a fourth step of covering the photoelectron emitting part with polycrystaline GaAs; a fifth step of forming the first electrode connected to the photoelectron emitting part on the selected surface of the substrate; a sixth step of forming the second electrode so that one of the ends of the second electrode is positioned above the photoelectron emitting part; and a seventh step of removing the polycrystaline GaAs after performing the sixth step. Since the melting point of aluminum nitride is 2000 degrees Celsius or more, it does not deteriorate in manufacturing carbon nano tubes (Temperatures increase up to approximately 1600 degrees Celsius during the manufacturing process.).

Further, an electromagnetic wave generation apparatus may be manufactured using the following manufacturing method. The method includes the following five steps: a first step of forming an $Al_{1-x-y}In_xGa_yN$ ($0 \leq x \leq 1$, $0 \leq y \leq 1$) layer in order to form a photoelectron emitting plane on one of the surfaces of the substrate; a second step of depositing polycrystaline GaAs on a part of the layer; a third step of forming a first electrode connected to the layer; a fourth step of forming a second electrode so that an end of the second electrode is positioned above the polycrystaline GaAs; and a fifth step of removing the polycrystaline GaAs after performing the fourth step.

It is desirable that GaAs be filled into between both the electrodes in the manufacturing process in preparation for forming a cavity between both the electrodes. Since GaAs can be later removed by performing etching using a sulfuric etchant because etching speeds of silicon and metals are slower than that of GaAs, the use of GaAs as a filling makes it possible to form such a cavity.

The present invention can provide an electromagnetic generation apparatus that is compact and generates a high power terahertz wave and manufacturing methods of the electromagnetic generation apparatus.

FURTHER INFORMATION ABOUT TECHNICAL BACKGROUND TO THIS APPLICATION

The disclosure of Japanese Patent Application No. 2004-228939 filed on Aug. 5, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIGS. 6A to 6F each is a section view indicating a manufacturing method of the terahertz wave resonator in the first embodiment;

FIGS. 7A to 7E each is a section view indicating a manufacturing method of the terahertz wave resonator in the first embodiment;

FIGS. 10A to 10F each is a first section view indicating a manufacturing method of the terahertz wave resonator in the second embodiment;

FIGS. 14A to 14D each is a section view indicating a manufacturing method of the terahertz wave resonator in the third embodiment;

FIGS. 15A to 15E each is a section view indicating a manufacturing method of the terahertz wave resonator in the third embodiment;

DESCRIPTION OF THE PREFERRED EMBODIMENT(S)

Best modes for realizing the present invention will be described below with reference to figures.

First Embodiment

First, a terahertz wave resonator of a first embodiment will be described with reference to FIG. 2 to FIGS. 7A to 7E. The terahertz wave resonator is an example of an electromagnetic wave generation apparatus of the present invention.

Figure 1:
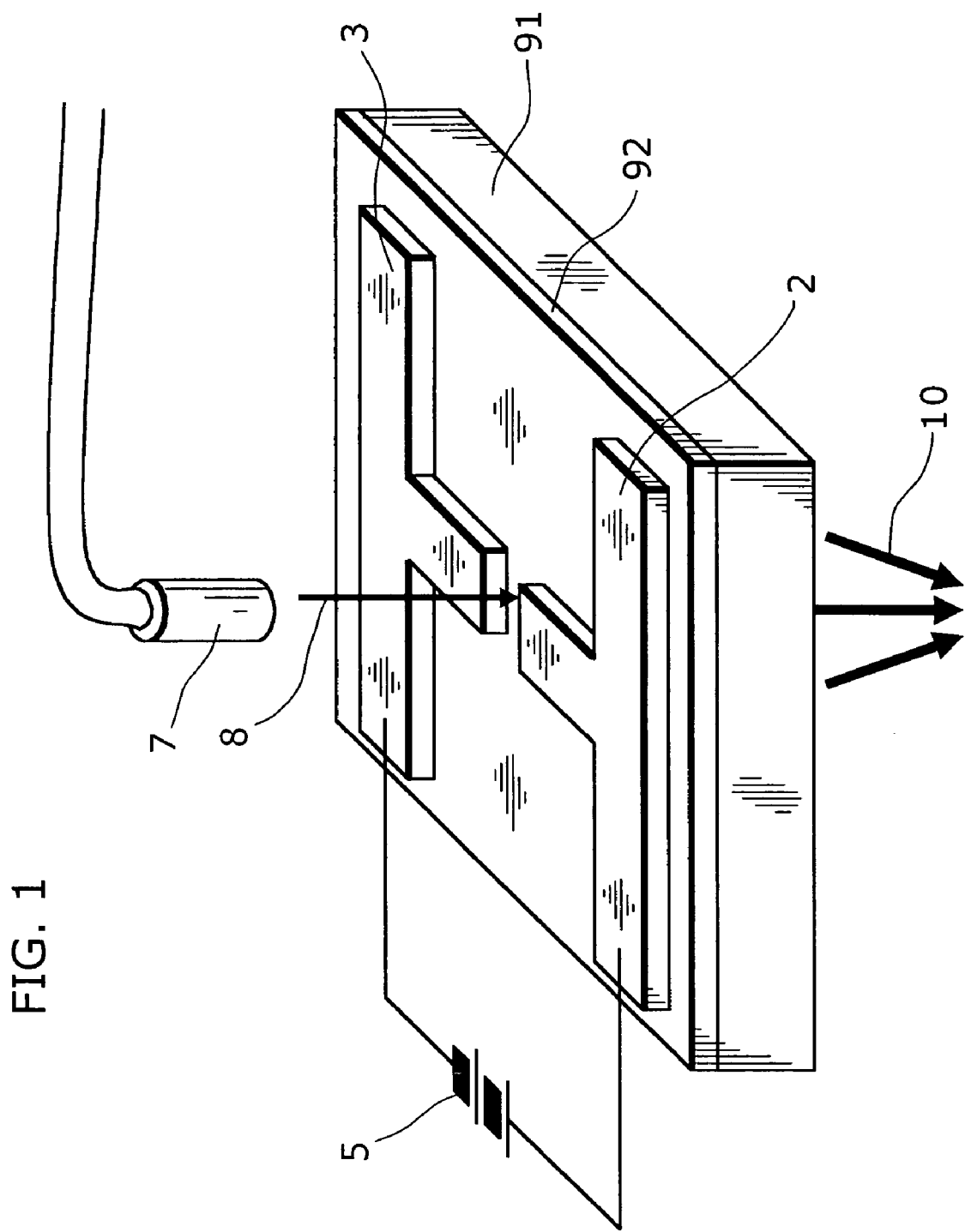
FIG. 1 is a perspective view of a conventional terahertz wave resonator.
Figure 2:
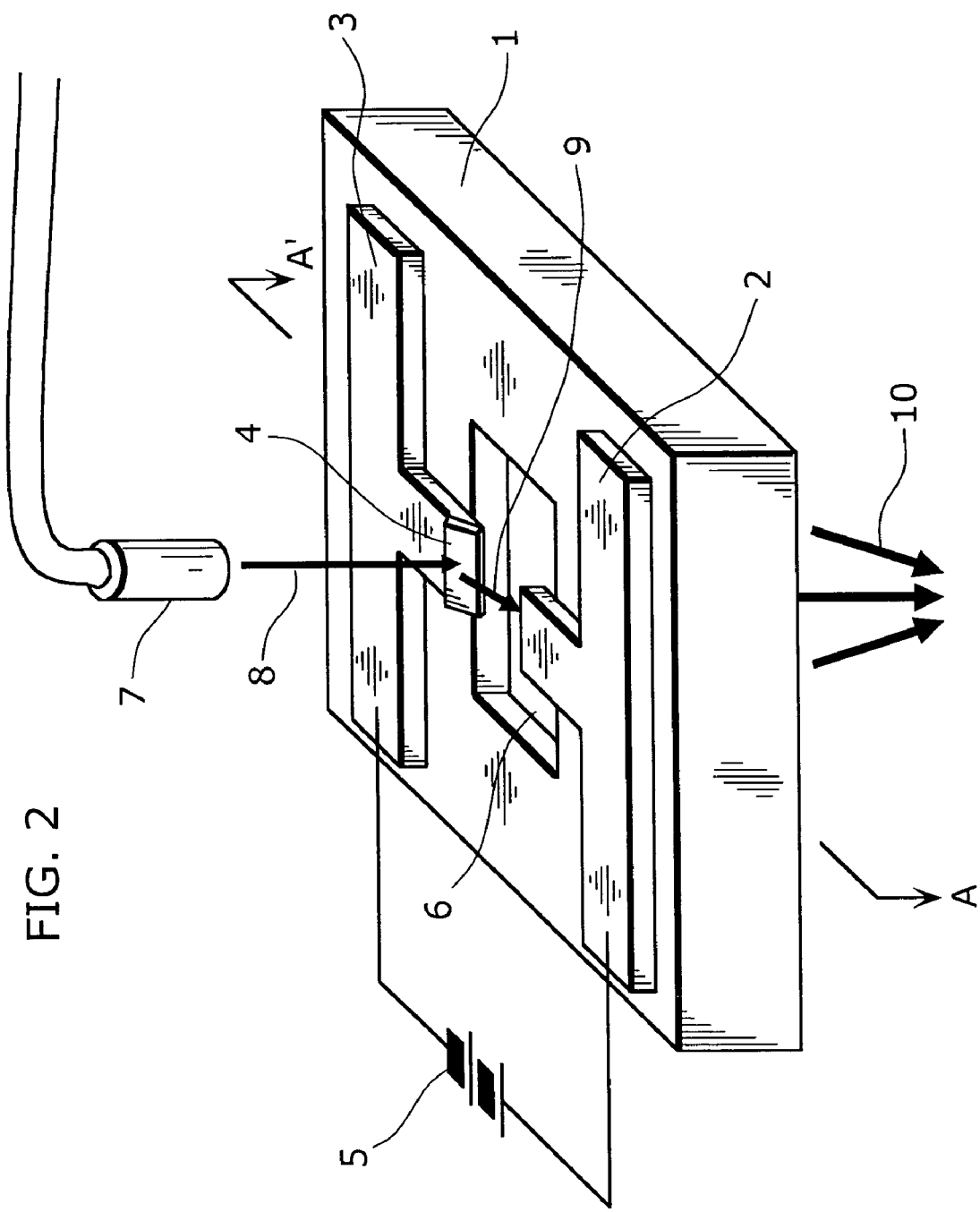
FIG. 2 is a perspective view of a terahertz wave resonator in a first embodiment.
Figure 3:
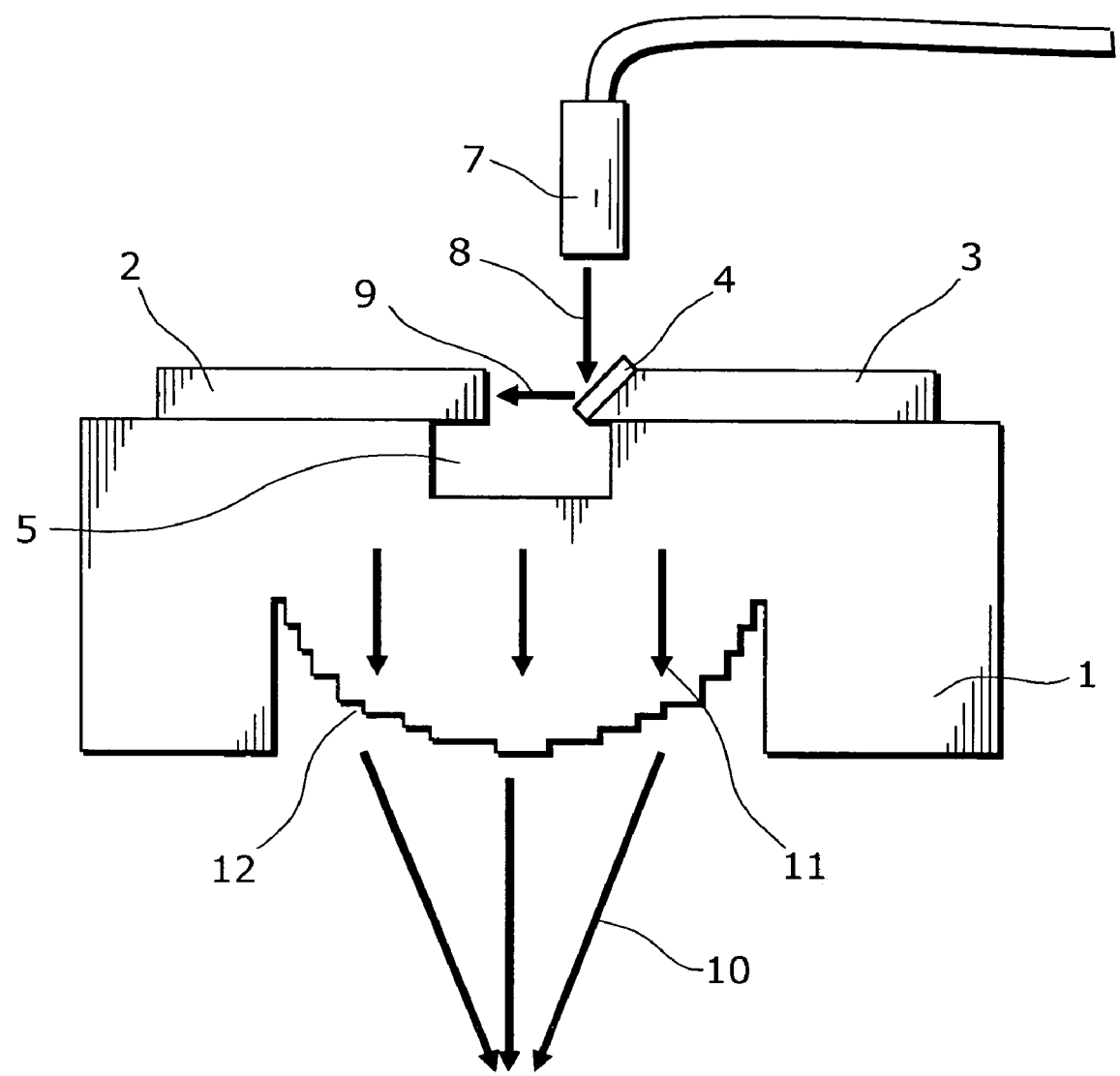
FIG. 3 is a section view of the main part of the terahertz wave resonator in the first embodiment.

FIG. 2 is a perspective view of the terahertz wave resonator in the first embodiment. FIG. 3 is a section view A to A' of the resonator.

A positive electrode 2 and a negative electrode 3 are formed on silicon substrate 1 having a high resistance. The positive electrode 2 and the negative electrode 3 each is formed using gold, has a plate shape, and has a thickness of 0.2 μm. The positive electrode 2 and the negative electrode 3 each is formed to become T-shaped by means of photolithography. The length of the vertical line in T is 150 μm and the length of the corresponding horizontal line is 2 mm. There is a gap d of 2 μm between the positive electrode 2 and the negative electrode 3. The positive electrode 2 and the negative electrode 3 constitute a so-called dipole antenna. A power supply 5 applies a direct voltage V of 100 V between both the electrodes.

The end of vertical line in T of the negative electrode 3 is cut to have a plane leaning 45 degrees. On the end an S-20 photoelectron emitting plane 4 having a thickness of 100 nm is formed using Sb, K, Na and Cs (As for the S-20 photoelectron emitting plane, refer to pp. 156 to 158 of Denshikan Kogaku (electronic tube engineering), written by Shigenori Hamada and Masanobu Wada, published by Corona Co.). The photoelectron emitting plane 4 emits electrons when light is irradiated. In order to adjust a focus of light to the photoelectron emitting plane 4, a laser radiation exit 7 is set. The laser radiation exit 7 radiates a Ti:sapphire femtosecond laser having a wavelength of 780 nm that has been mode-locked by Argon laser (the femtosecond laser itself is not shown in a figure. The light from the laser is guided towards the laser radiation exit 7 through a fiber.). A concave 6 is formed in the substrate 1 in the proximity of the gap including the lower part of the gap. The concave 6 is an example of the electromagnetic wave resonator. A lens 12 is formed below the concave 6 in the lower part of the silicon substrate 1 (refer to FIG. 3, the diameter of the lens 12 is 200 μm). The silicon lens 12 has a two-stairstep form and the step height between these stairsteps is approximately 15 to 40 μm. This width is sufficiently narrower than the terahertz wavelength of 100 to 300 μm. Therefore, the lens 12 can be regarded as equivalent to a hemispherical lens. Also, the terahertz wave generation apparatus excluding the laser is held in a vacuum state of $10^{-4}$ Pa or less.

Note that the distance between the positive electrode 2 and the negative electrode 3 (gap d) and/or the voltage to be applied by the power supply 5 are/is determined so that the time period from the time when electrons are emitted from the photoelectron emitting plane 4 to the time when the emitted electrodes reach the positive electrode 2 falls within the range between 0.01 psec and not less than 10 psec.

Figure 4:
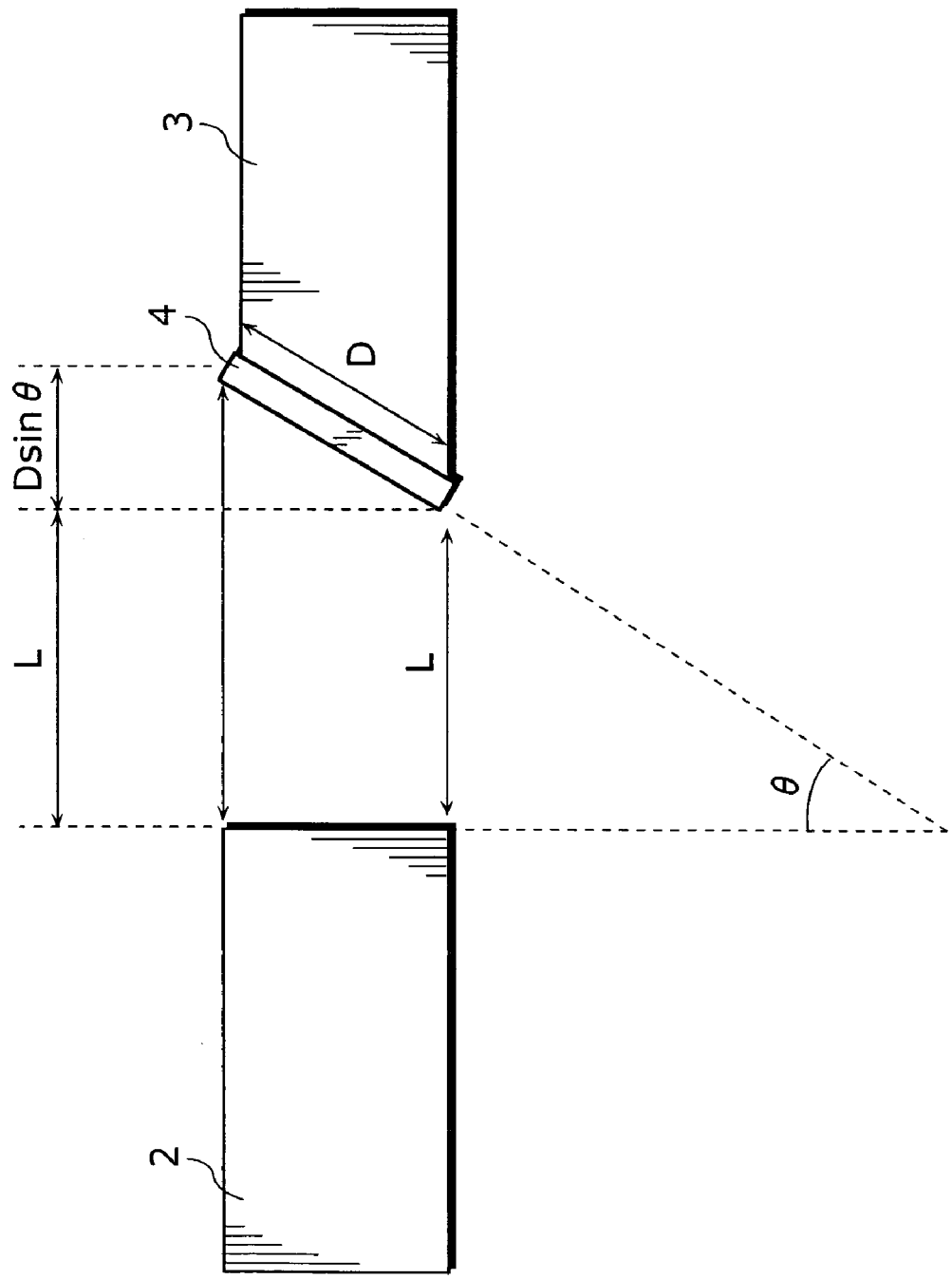
FIG. 4 is an illustration of the positional relationship between a photoelectron emitting plane 4 and a positive electrode 2 in the first embodiment.

Also, it is desirable that the following Equation 1 be satisfied, when, as shown in FIG. 4, the angle between the photoelectron emitting plane 4 and the electron incidence plane of the positive electrode 2 is θ, the shortest distance between the positive electrode 2 and the negative electrode 3 is L, and the length along the electrodes of the photoelectron emitting plane 4 is D.

$$D \sin \theta / L \leq 0.1 \quad \text{(Equation 1)}$$

When Equation 1 is satisfied, the difference between the minimum value L and the maximum value (L+D sin θ) of travel distances of electrons that are emitted from the photoelectron emitting plane 4 falls within ten percent of the smallest value L. This makes it possible to control the pulse width not to spread exceeding an allowable range because of the difference in travel distances of electrons. This means that it is possible to improve spectrum purity of the terahertz wave.

Basic operations of the terahertz wave resonator will be described below.

The pulse light 8 (having a pulse width of 80 fsec) emitted from a femtosecond laser is irradiated on the photoelectron emitting plane 4 resulting in generating photoelectrons. These generated photoelectrons become an electron pulse because of the electric field between both the electrodes and run to the positive electrode 2. During the time, an induced current keeps flowing between both the electrodes (inside a dipole antenna). Since a concave 6 is formed in the substrate 1, such an electron pulse is not affected by the substrate 1. When such an electron pulse reaches the positive electrode 2, the current flowing inside the antenna ceases to flow. In the case where the time period from the time when the electron pulse is generated to the time when the electron pulse disappears falls within the range between 0.01 psec and not more than 10 psec, a terahertz current flows inside the antenna. Since the antenna has a shape that allows the terahertz wave to radiate, a terahertz wave 11 is generated inside the high resistance silicon substrate 1. Since the refractive index of silicon that constitutes the substrate 1 is higher than that of air, the generated terahertz wave runs to the direction of the back surface direction of the substrate 1. The terahertz wave is converged by the silicon lens 12 on the back surface of the substrate 1, and then extracted as an outside light 10.

After irradiating the pulse light 8 on the photoelectron emitting plane 4 under this condition, we measured the time duration during which current flows inside the antenna (between both electrodes). As a result, the current has flowed for 0.8 psec. It indicated that a terahertz wave having a component of approximately 1.3 THz was generated. We reviewed the reason why the result was obtained.

Since the voltage V to be applied by the power supply 5 is 100 V and the gap d between the positive electrode 2 and the negative electrode 3 is 2 μm, when the time duration during which current flows between both the electrodes is τ according to the following Equation 4, τ equals to 0.67 psec.

$$\tau = d \times \sqrt{(2\ m/eV)} \qquad \text{(Equation 4)}$$

Figure 5:
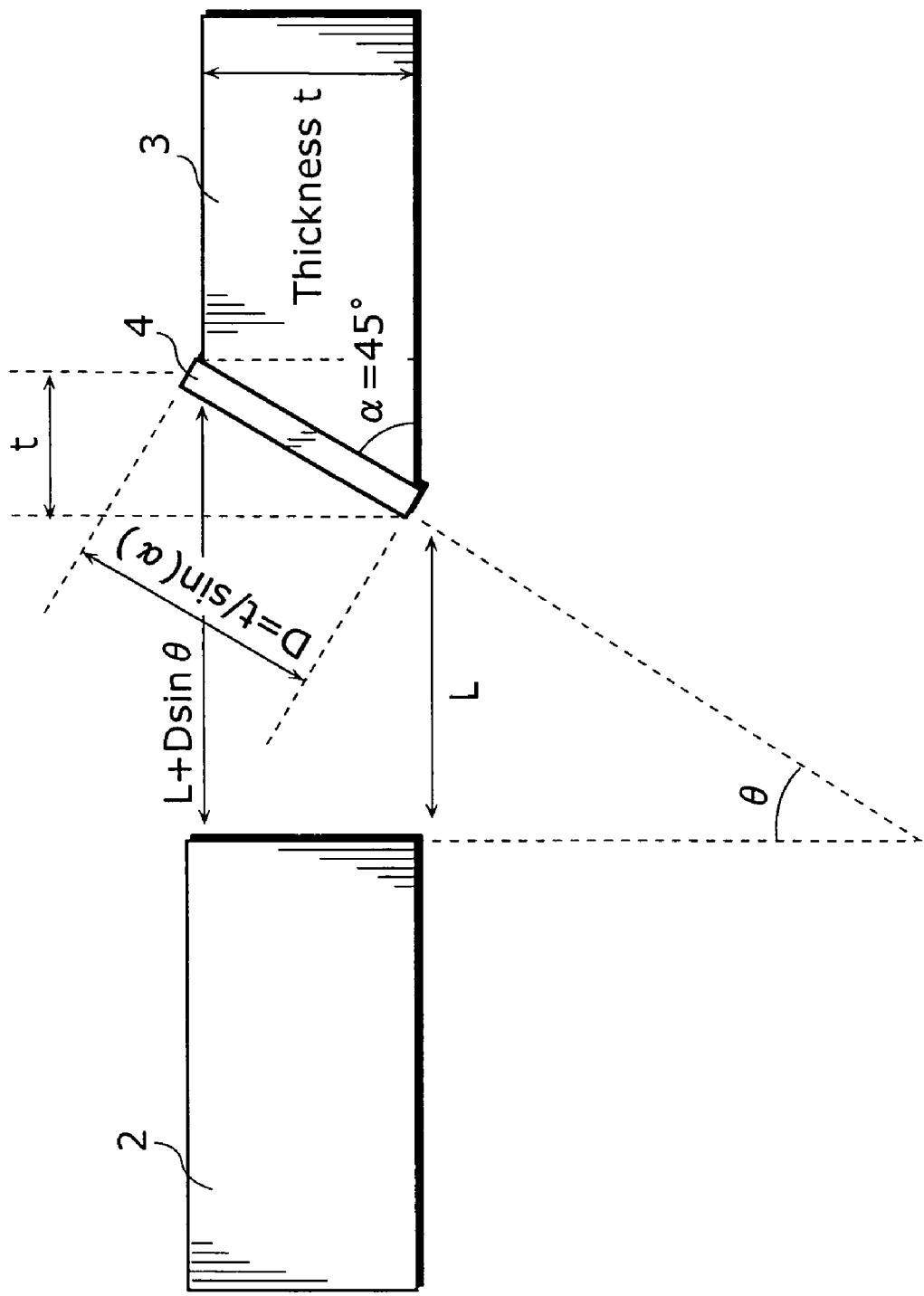
FIG. 5 is an illustration of the distance between the photoelectron emitting plane 4 and an electron incidence plane of the positive electrode 2 in the first embodiment.

On the other hand, as shown in FIG. 5, the photoelectron emitting plane 4 is formed on an end of the negative electrode 3 (having a thickness t of 0.2 μm) that has been cut to have a plane leaning 45 degrees. In other words, the length D of the photoelectron emitting plane 4 along the electrode direction is represented as: D=0.2/sin (45 degrees)=0.28 μm. Therefore, the travel distances d of photoelectrons are represented as: d=2 to 2+0.2=2 to 2.2 μm. The maximum time duration during which current keeps flowing inside the antenna under the condition that the difference in these travel distances is 0.74 psec according to Equation 4, and the result is substantially the same as the actually measured value.

Note that the distance between at least a part of the concave 6 and the counterpart of the concave 6, for example, the width or the length is set as the amplitude of resonance. In an example case where a 1.5 terahertz wave is desired, since the wavelength of the wave is 200 μm, the width of the concave 6 is made to be, for example, 100 μm that is half the wavelength of the 1.5 terahertz wave. In this way, it becomes possible to obtain a terahertz light that is stronger (higher power) and having a smaller spectrum width (higher spectrum purity).

Also, the pulse width of the pulse light 8 is not limited to 80 fsec. In other words, any pulse width is suffice as long as it is 1 psec or below.

Next, a manufacturing method of the terahertz wave resonator of the first embodiment will be descried below with reference to FIGS. 6A to 6F and FIGS. 7A to 7E.

First, a photo resist 40 with an opening is formed on the Si substrate 1 by means of photolithography. Next, a concave 6 is formed (FIG. 6A) by means of reactive plasma etching using $CF_4$. After polycrystaline GaAs 41 is deposited on the surface according to the sputtering method, the photo resist 40 is removed, and the concave 6 is filled with polycrystaline GaAs 41 (FIG. 6B). Next, the positive electrode 2 and the negative electrode 3 containing gold are formed using a photolithography and electron beam deposition apparatus (FIG. 6C). At this time, the positive electrode 2 and the negative electrode 3 are formed so that the gap d between the positive electrode 2 and the negative electrode 3 becomes 2 μm. Note that each of the electrodes is formed in T form on the surface of the substrate 1.

Next, the end of the negative electrode 3 is cut diagonally using a ion beam focusing device (gallium (Ga) ion beam 42). At the time when polycrystaline GaAs 41 is cut off in part by the Ga ion beam 42, the concave 6 is protected so that it is not damaged by the Ga ion beam 42 (FIG. 6D). Next, after forming a photo resist 43 by means of photolithography, a photoelectron emitting plane 4 is formed according to the sputtering method using Sb, K, Na and Cs (FIG. 6E). Note that Sb, K, Na and Cs are also deposited on the photo resist 43, but it is not shown in FIG. 6E. After that, the photo resist 43 is removed, and then the polycrystaline GaAs 41 is also removed by means of wet etching using a sulfuric etchant (FIG. 6F).

Next, after the surface of the substrate 1 is covered with the photo resist 44 for protection, a photo resist 45 is formed on the back surface of the substrate 1 by means of photolithography. The photo resist 45 has a circle-shaped opening (the diameter of the outer periphery is 200 μm, and the inner diameter is 20 μm), and the center of the circle is adjusted to the center between the positive electrode 2 and the negative electrode 3 using a double side alignment apparatus (FIG. 7A). After that, a concave 46 (having a depth of 20 μm) is formed so that it becomes substantially vertical to the opening by means of $CF_4$ reactive ion etching (FIG. 7B). After the photo resist 45 is fully removed, the surface of the substrate 1 is covered with a photo resist 44 for protection. After that, a photo resist 47 is formed on the back surface of the substrate 1 by means of photolithography. The photo resist 47 has a circle-shaped opening (the diameter of the outer periphery is 200 μm, and the inner diameter is 40 μm), and the center of the circle is adjusted to the center between the positive electrode 2 and the negative electrode 3 using a double side alignment apparatus. And then reactive ion etching of this is performed so as to make it have a depth of 20 μm. In this way, the difference between stairsteps 48 is formed, the deeper stairstep being the concave 46 having a depth of 40 μm, and the shallower stairstep being the part having a depth of 20 μm that has been newly exposed by means of the reactive ion etching (FIG. 7C).

Next, as shown in FIG. 7D, a silicon lens 12 having a stairstep form and a diameter of 200 μm is formed by repeating the following steps several times (for example, 10 times) in sequence: a step of forming a photo resist having the above opening; and a step of performing ion etching (FIG. 7E). Note that, at this time, the inner diameter of the opening of the photo resist is adjusted to become hemispherical. Lastly, after wiring of the electrodes is completed, a terahertz wave resonator is completed by placing and sealing the whole resonator in a vacuum glass tube and by setting an optical fiber for emitting light at a right position.

Second Embodiment

Figure 8:
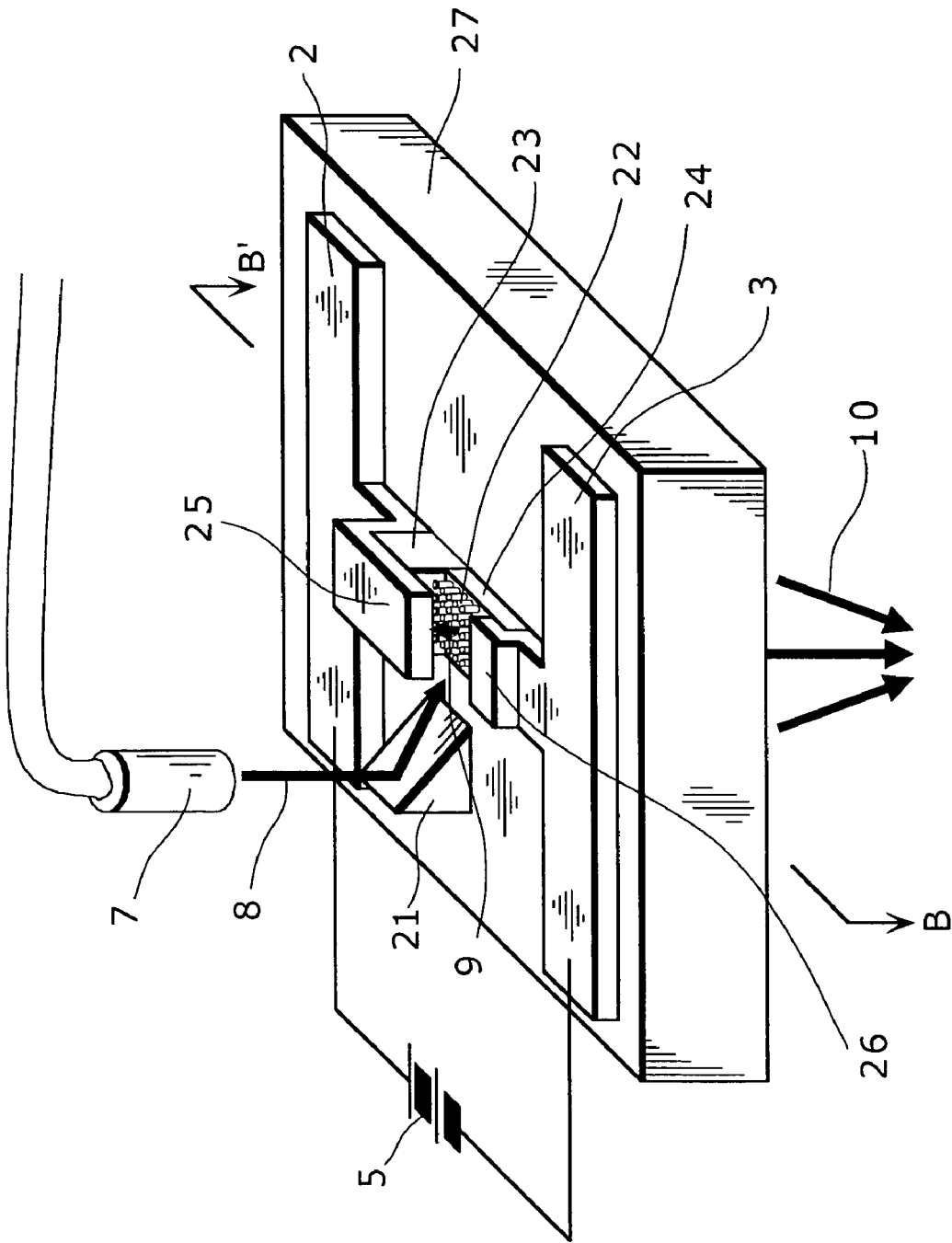
FIG. 8 is a perspective view of a terahertz wave resonator in a second embodiment.
Figure 9:
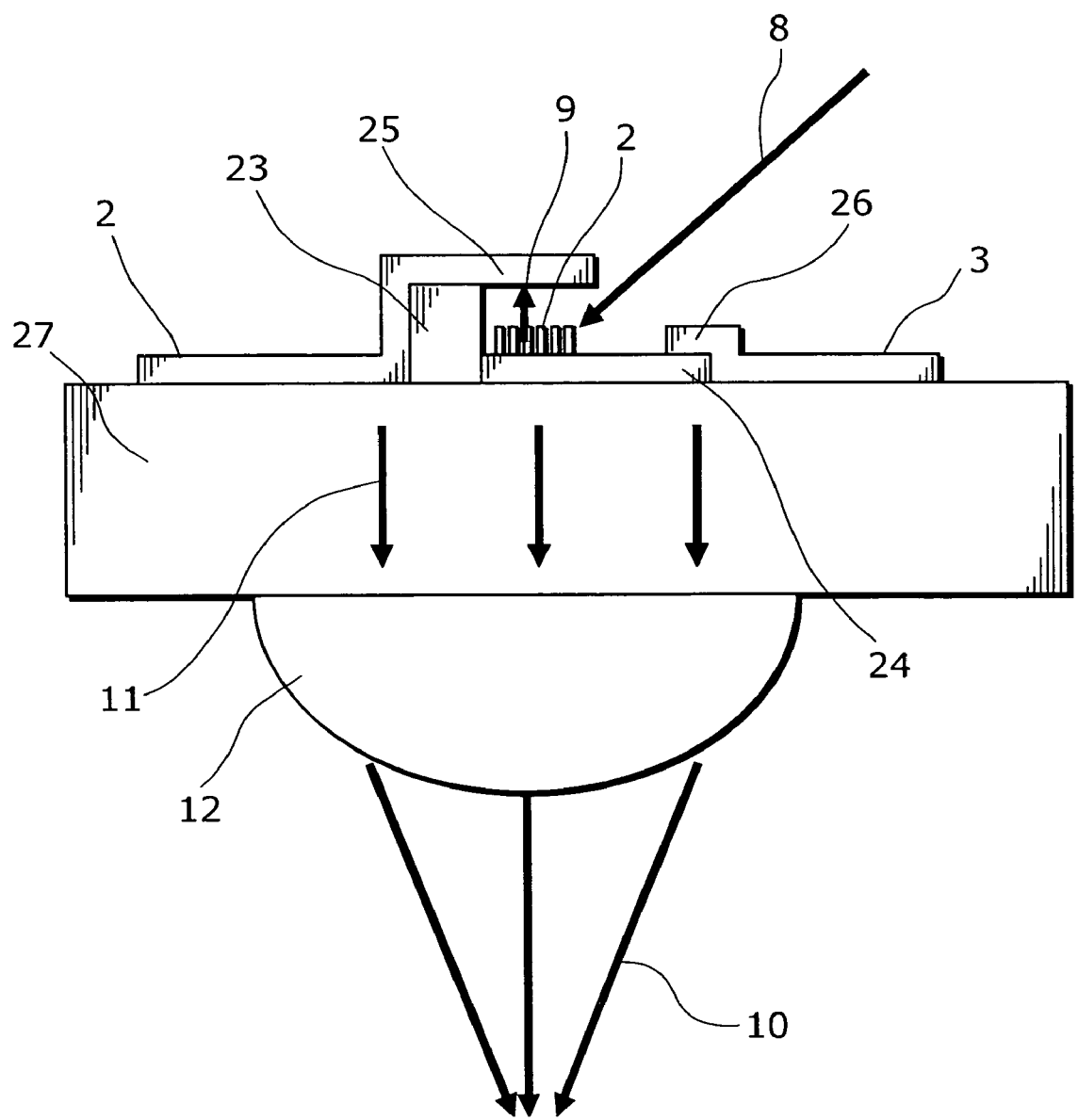
FIG. 9 is a section view of the main part of the terahertz wave resonator in the second embodiment.

FIG. 8 is a perspective view of a terahertz wave resonator in a second embodiment. FIG. 9 shows the section view B to B' of the terahertz wave resonator. An incident light 8 in FIG. 9 is actually present in the vertical direction shown in the paper sheet, however, for simplification, it is shown in the same surface as the section view of the resonator.

A conductive epitaxial layer 24 is formed on a part of the semi-insulating SiC substrate 27. On the conductive epitaxial layer 24 a CNT electron emitter 22 is formed, the emitter being composed of carbon nano tubes (CNT). A negative electrode 3 is formed on the conductive epitaxial layer 24 through a contact part 26. An electron catching unit 25 is formed facing the CNT electron emitter 22 through the $SiO_2$ spacer layer 23. The electron catching unit 25 is connected to the positive electrode 2. A power supply 5 applies voltage to between the positive electron 2 and the negative electron 3. An aluminum mirror 21 is formed on the side surface of the CNT electron emitter 22. The mirror 21 deflects the path of light 8 that is radiated from a laser radiation exit 7 vertically on the surface of the substrate 27, and reflects the light on the CNT electron emitter 22. A high resistance silicon lens 12 is formed on the back surface of the SiC substrate 27 (refer to FIG. 9). Like in the case of the first embodiment, each of the positive electrode 2 and the negative electrode 3 is T-shaped, and both the electrodes constitute a dipole antenna. Also, the whole apparatus is held in a vacuum state having a pressure of $10^{-8}$ Pa or below.

Next, the operation mechanism of the terahertz wave resonator of the second embodiment will be described.

The femtosecond laser light 8 radiated from outside is reflected on a mirror 21, and then becomes an incident light coming into the CNT electron emitter 22. Since the work function of carbon nano tubes is 4.5 eV (refer to pp. 864 to 867 of "Barrier Effect on Field Emission from Stand-alone Carbon Nanotube", published in Japanese Journal of Applied Physics, vol. 43, No. 2 (2004), by H. Tanaka et. Al.), the following light was used: the light of triple harmonics of a Ti:sapphire femtosecond laser having a wavelength of 780 nm that has been mode locked by an Argon laser (the triple harmonics is 4.8 eV, and a BBO ($\beta$-$BaB_2O_4$) crystal is used as a crystal for harmonics). The power supply 5 applies a voltage of 30 V to between electrodes. When an incident light comes into the CNT electron emitter 22 under this state, the photon energy increases the energy of free electrons exceeding the work function. At this time, the photoelectron emission 9 is observed. Like in the case of the first embodiment, it takes approximately 0.67 psec for such photoelectrons to reach the electron catching part 25. As a result, terahertz wave 11 is generated between the positive electrode 2 and the negative electrode 3. The terahertz wave 11 is emitted outside as a condensed light 10 through the silicon lens 12.

FIGS. 10A to 10F and FIG. 11A to 11E each shows a manufacturing method of the terahertz resonator in the second embodiment.

An n-type SiC substrate 60 is welded to the semi-insulating SiC substrate 27 using a wafer bonding method (FIG. 10A). At this time, the welded surface of the substrate 60 is made to be carbon rich. After the n-type SiC substrate 60 is slimed down to a thickness of 1 μm by means of polishing and a KOH wet etching, the part 61 that will become an electron emitter later on is formed by means of photolithography and an $SF_6$ dry etching (FIG. 10B). Next, a difference between stairsteps 62 is formed in the part where CNT is not formed by means of photolithography and an $SF_6$ dry etching (FIG. 10C).

Next, the part where CNT is not formed is protected using a polycrystaline AlN thin film 63 by means of photolithography and the metal organic chemical vapor deposition (FIG. 10D). At this time, the exposed SiC surface is a Si surface. By heating this in a vaccum at 1600 degrees Celsius for approximately 30 minutes, carbon nano tubes 22 are generated (FIG. 10E, refer to pp. 889 to 895 of *carbon nano tube* edited by Kazuyoshi Tanaka, published by Kagakudojin in 2001). Next, in order to protect the carbon nano tubes, a polycrystaline GaAs 64 is grown using the protection film 63 as a mask (FIG. 10F). After that, the polycrystaline AlN is removed using diluted KOH solution.

Figure 11A:
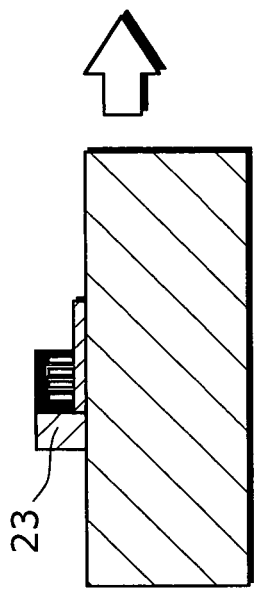
FIGS. 11A to 11E each is a second section view indicating a manufacturing method of the terahertz wave resonator in the second embodiment.
Figure 11B:
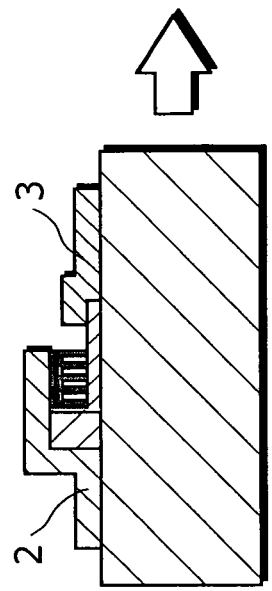
Figure 11C:
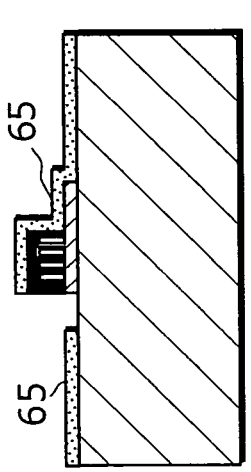
Figure 11D:
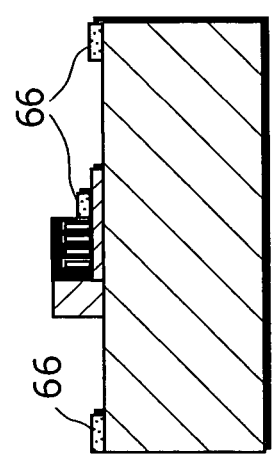
Figure 11E:
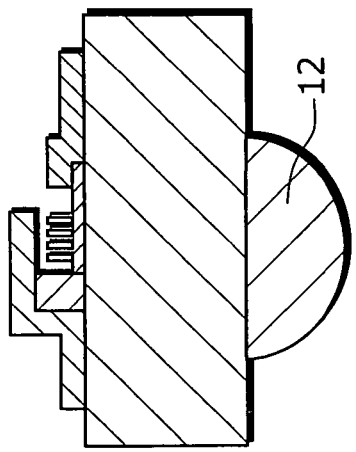

Next, a photo mask 65 is formed by means of photolithography (FIG. 11A), and a $SiO_2$ spacer layer 23 is formed according to the sputtering method (FIG. 11B). Next, a photo mask 66 for electrodes is formed by means of photolithography (FIG. 11C), and then the positive electrode 2 and the negative electrode 3 are formed (FIG. 11D). After that, the polycrystaline GaAs is removed using a sulfuric etchant. A silicon lens 12 is pressed on the substrate 27 to be fixed. A mirror (not shown) is attached to it using an AuSn eutectic crystal solder. After wiring of electrodes is completed, a terahertz wave resonator is completed by placing and sealing the whole resonator in a vacuum glass tube and setting an optical fiber for excitation at a right position.

Note that the semi-insulating SiC substrate 27 may be replaced by a diamond substrate.

Third Embodiment

Figure 12:
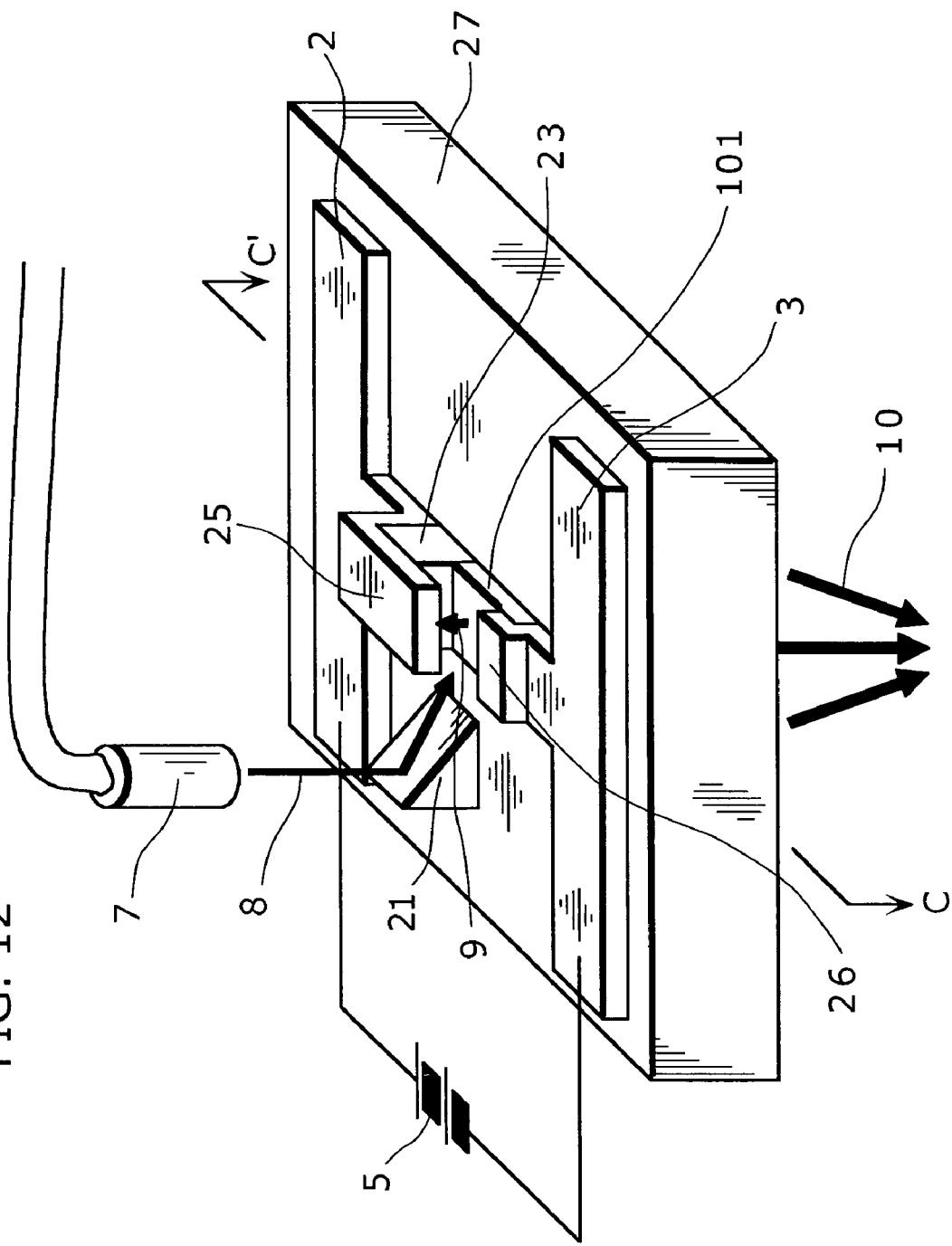
FIG. 12 is a perspective view of a terahertz wave resonator in a third embodiment.
Figure 13:
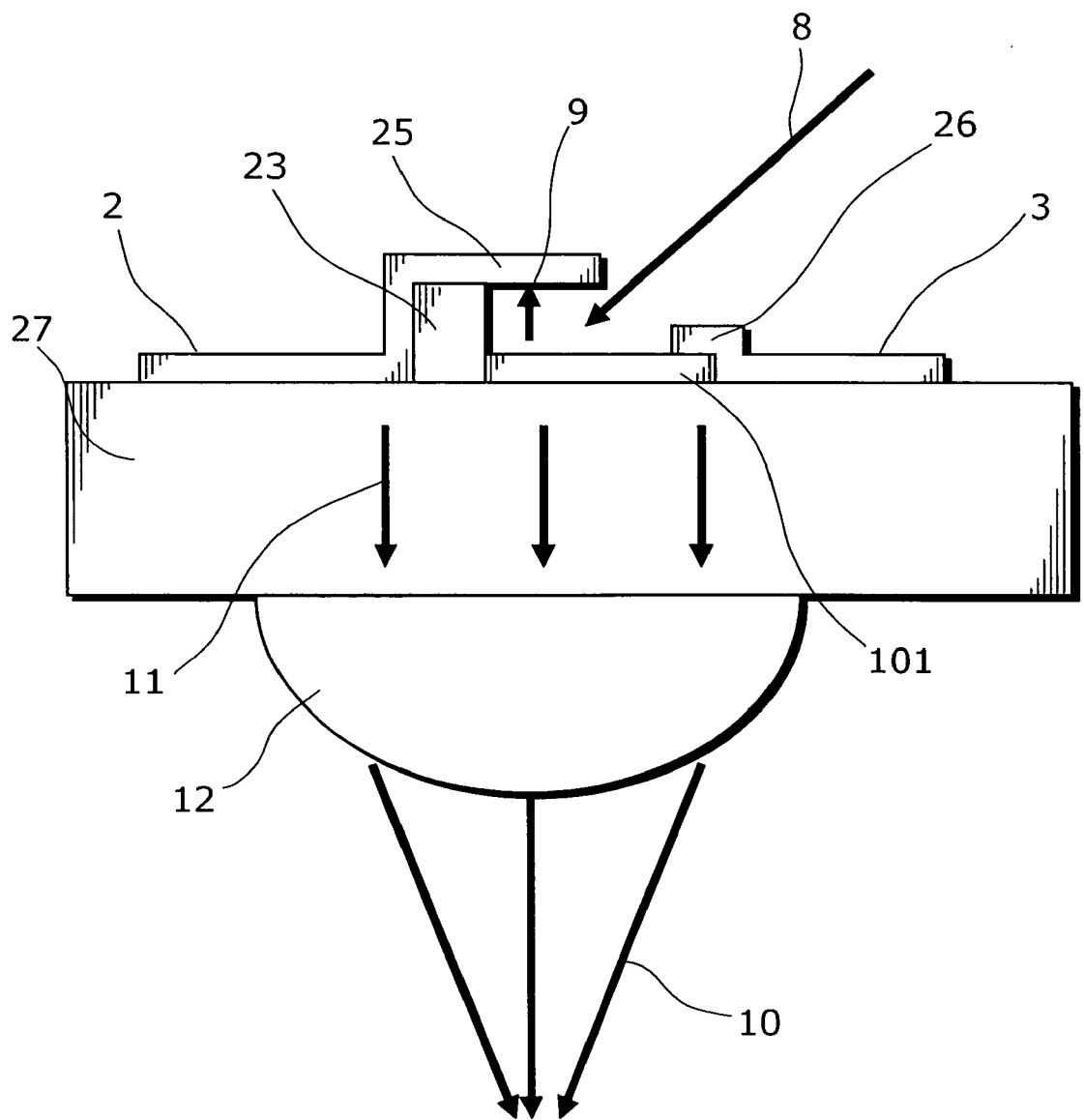
FIG. 13 is a section view of the main part of the terahertz wave resonator in the third embodiment.

FIG. 12 is a perspective view of a terahertz wave resonator in a third embodiment. FIG. 13 each shows the section view C to C' of the terahertz wave resonator. An incident light 8 in FIG. 13 is actually present in the vertical direction shown in the paper sheet, however, for simplification, it is shown in the same surface as the section view of the resonator.

A layer 101 (simply called AlN 101 hereinafter), which is made of aluminum nitride (AlN) into which silicon is doped, is formed on a part of a semi-insulating SiC substrate 27. It is known that AlN into which silicon is doped emits electrons under a low threshold voltage (refer to pp. 1835 to 1837 of Appl. Phys. Lett. 78 (2001), by M. Kasu and N. Kobayashi). Therefore, AlN 101 functions as an electron emitter. A negative electrode 3 is formed on the AlN 101 through a contact part 26. An electron catching part 25 is formed facing the AlN 101 through a $SiO_2$ spacer layer 23. The electron catching part 25 is connected to the positive electrode 2. A power supply 5 applies voltage to between the positive electrode 2 and the negative electrode 3. A mirror 21 is formed on the side surface of the AlN 101 (refer to FIG. 13). The mirror 21 deflects the path of light 8 to be radiated from a laser radiation exit 7 vertically on the substrate 27, and reflects light on the AlN 101. A high resistance silicon lens 12 is formed on the back surface of the SiC substrate 27. Like those cases of the first and second embodiments, each of the positive electrode 2 and the negative electrode 3 is T-shaped, and both the electrodes constitute a dipole antenna. Also, the whole resonator is held in a vacuum state of $10^{-8}$ Pa or less.

Next, the operation of the terahertz wave resonator of the third embodiment will be described.

The femtosecond laser light 8 radiated from outside is reflected on a mirror 21, and then becomes an incident light coming into the AlN 101. The power supply 5 applies 30 V to between both the electrodes. Since the band gap of AlN is 6.2 eV, the following light was used: the light of quadruple harmonics of a Ti:sapphire femtosecond laser having a wavelength of 780 nm that has been mode locked by an Argon laser (the quadruple harmonics is 6.35 eV, and a BBO ($\beta$-$BaB_2O_4$) crystal is used as a crystal for harmonics). This voltage is slightly smaller than a threshold value at which AlN emits electrons. Therefore, the AlN layer is almost ready to emit electrons. When light is radiated on the AlN 101, photon energy increases the energy of free electrons. Consequently, the energy of free electrons exceeds the potential energy between the AlN 101 and a vacuum, resulting in photoelectron emission 9. Like the case of the first embodiment, it takes approximately 0.67 psec for the photoelectrons to reach the electron catching unit 25. As a result, a terahertz wave 11 is generated between the positive electrode 2 and the negative electrode 3. The terahertz wave 11 is emitted outside as a condensed light 10 through a silicon lens 12.

FIGS. 14A to 14D and FIG. 15A to 15E each shows a manufacturing method of the terahertz wave resonator of the third embodiment.

The AlN layer 102 is grown on the semi-insulating SiC substrate 27 doping silicon according to the molecular beam epitaxy method (FIG. 14A). A part 101 that will become an electron emitter later on is formed by means of photolithography and a KOH wet etching (FIG. 14B). Next, a photo resist 103 is formed by means of photolithography (FIG. 14C). After that, a polycrystaline GaAs 64 is grown (FIG. 14D).

Next, a photo mask 65 is formed by means of photolithography (FIG. 15E), and a $SiO_2$ spacer layer 23 is formed using the sputtering method (FIG. 15E). Next, a photo mask 66 for electrodes is formed by means of photolithography (FIG. 15A), and then a positive electrode 2 and a negative electrode 3 are formed (FIG. 15D). After that, the polycrystaline GaAs is removed using a sulfuric etchant. Then a silicon lens 12 is pressed on the substrate 27 to be fixed, a mirror (not shown) is attached to the substrate using a PbSn solder (FIG. 15E), and the wiring of both the electrodes is completed. After that the whole resonator is placed in a vacuum glass tube, and an optical fiber for emitting light is attached at a right position so as to complete a terahertz wave resonator.

Note that the above-described third embodiment shows an example where an AlN 101 is formed on the semi-insulating SiC substrate 27. However, the AlN 101 may be replaced by a layer that is formed containing $Al_{1-x-y}In_xGa_yN$ ($0 \leq x \leq 1$, $0 \leq y \leq 1$).

Figure 16:
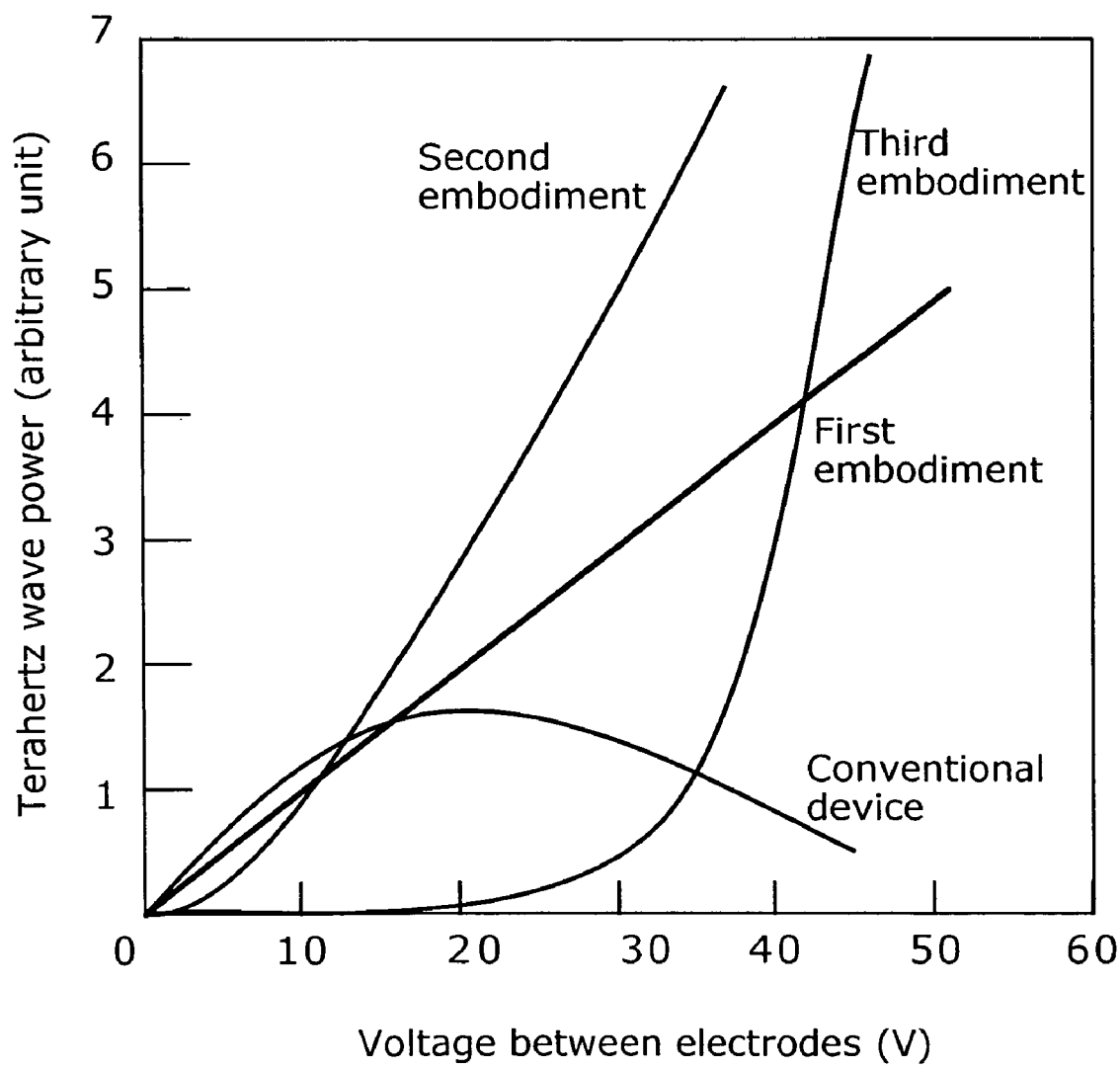
FIG. 16 is a diagram indicating each relationship between voltage applied to between a positive electrode and a negative electrode, and a terahertz wave power in each embodiment and in a conventional terahertz wave resonator.

FIG. 16 shows each relationship between voltage applied between the positive and negative electrodes and a terahertz wave power in each embodiment, where the frequency of the terahertz wave is 1.5 THz and the input light is a femtosecond pulse light having a wavelength of 780 nm. In the case of a conventional structure, the power decreases as the voltage to be applied becomes bigger from around 20 V. This is because the leakage current in T-GaAs becomes greater. In contrast, in the case of the first embodiment, it is indicated that such a leakage current is not generated and a great terahertz wave power is obtained because there is a vacuum between the positive and negative electrodes. Next, in the case of the second embodiment, the following results are obtained. Since the effective work function of the CNT is high in the low voltage region, electron emission is little. However, since the number of photoelectrons rapidly increases when the effective work function decreases and the electric field rises steeply in the high voltage region, the CNT is easy to emit electrons, and a high power terahertz wave is obtained as shown in FIG. 16. Lastly, in the case of the third embodiment, it is indicated that a threshold voltage becomes high, but the power of the terahertz wave becomes rapidly bigger under voltage higher than the threshold voltage, and the power of the terahertz wave in the third embodiment is bigger than the power of the terahertz wave in a conventional structure.

Figure 17:
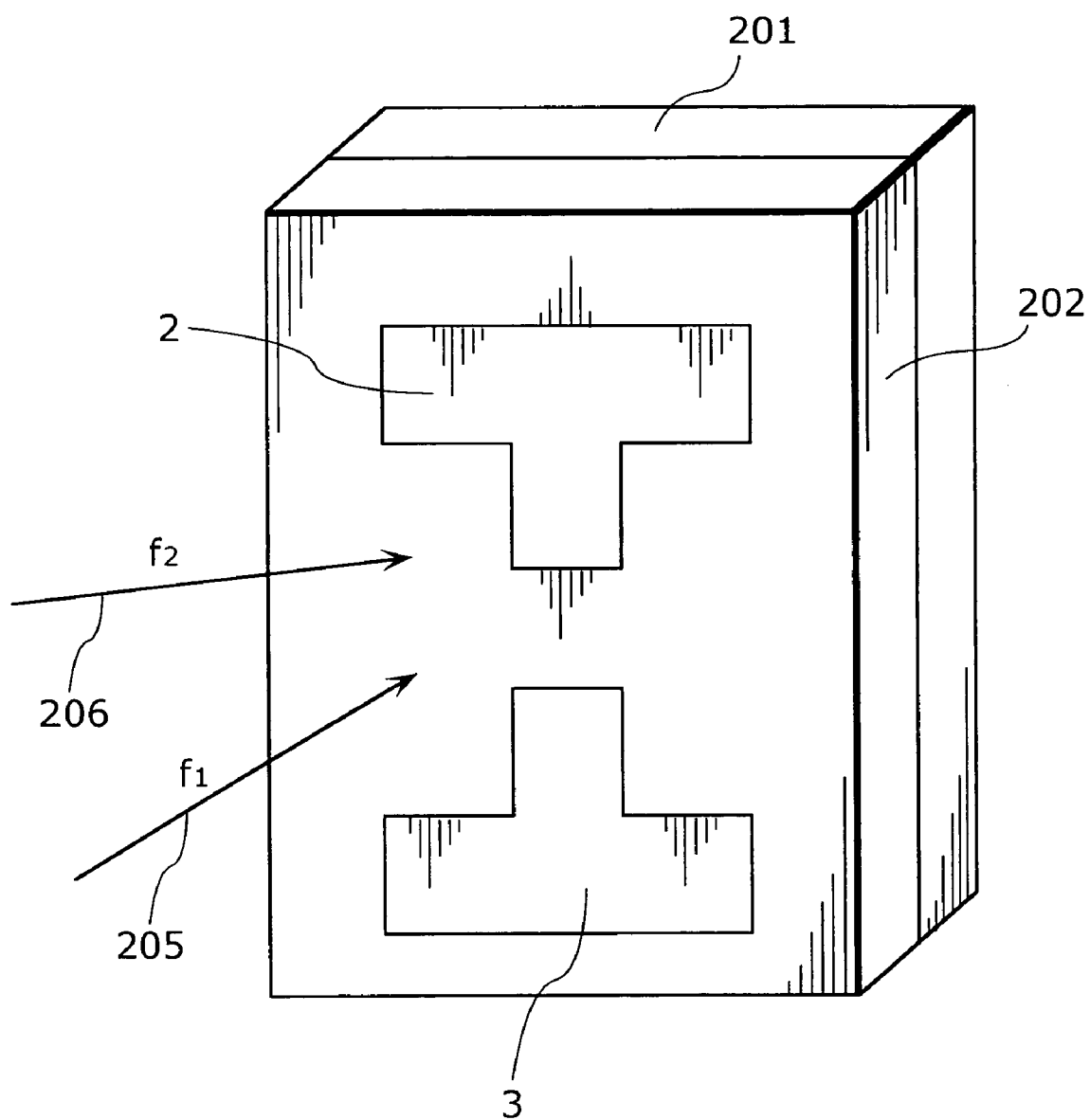
FIG. 17 is an illustration of a terahertz wave resonator that generates a terahertz wave from two laser lights, the terahertz wave having a difference frequency of these two laser lights.
Figure 18:
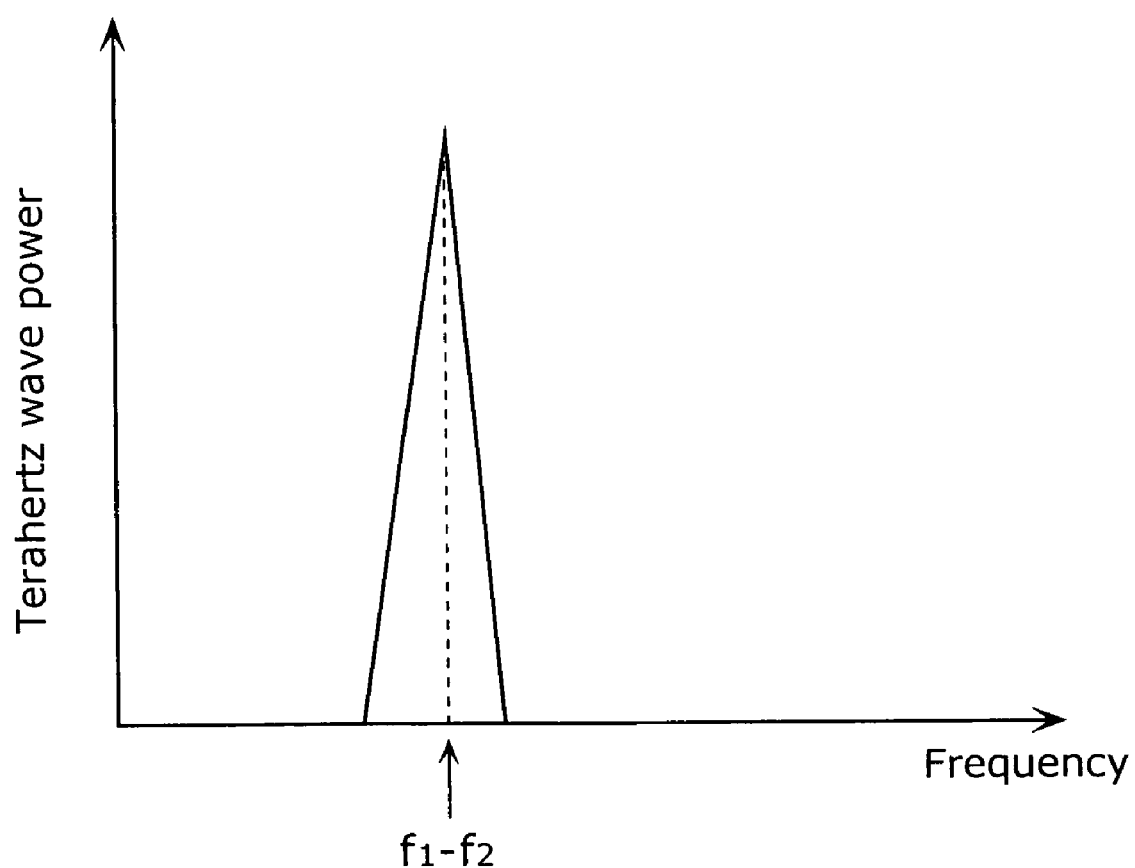
FIG. 18 is a diagram indicating a terahertz wave generated from two laser lights, the terahertz wave having a difference frequency of these two laser lights.

A femtosecond laser is used as a light source in the above embodiments, however, it should be noted that two laser light (such as semiconductor laser lights) can be used instead in order to generate a terahertz wave having a differential frequency of these two laser lights, and the generated terahertz wave can be radiated. FIG. 17 shows a terahertz wave resonator having (a) an LT-GaAs layer 202 made of a semiconductor having a short carrier lifetime that is deposited on a Si—GaAs substrate 201 and (b) a positive electrode 2 and a negative electrode 3 that are T-shaped and formed on the LT-GaAs layer 202, and shows how a light 205 having a frequency of $f_1$ and a light 2 having a frequency of $f_2$ respectively come into parts of the terahertz wave resonator. As shown in FIG. 18, when the difference between the frequency $f_1$ and the frequency $f_2$ is not less than 0.1 THz but not more than 10 THz, a terahertz wave having a peak frequency corresponding to the difference between both the frequencies can be obtained. Therefore, with a structure shown in FIG. 2, FIG. 8 and FIG. 12 instead of a structure shown in FIG. 17, an efficient terahertz wave generator can be obtained.

Those terahertz wave resonators are placed in a high vacuum where pressure is $10^{-4}$ Pa or less in the above described first to third embodiments. However, those terahertz wave resonators are placed under vacuum that enables preventing the generation of leakage current between the positive and negative electrodes in each of these terahertz resonators, more specifically, that enables preventing electric discharge triggered by application of voltage to between the positive and negative electrodes.

INDUSTRIAL APPLICABILITY

The electromagnetic wave generation apparatus of the present invention can generate a high power terahertz wave and analyze an object to be measured in a highly precise manner in the fields such as security and medical fields, and thus it is highly industrially practical.

What is claimed is:

1. An electromagnetic wave generation apparatus, comprising:
    a substrate;
    a first electrode, having a photoelectron emitting part, provided on a surface of said substrate;
    a second electrode provided on said surface of said substrate;
    a power supply source that applies voltage between said first electrode and said second electrode so that a potential of said second electrode is higher than a potential of said first electrode; and
    a light source that radiates one of time modulated light and wavelength modulated light,
    wherein said photoelectron emitting part emits electrons when an incident light is irradiated and, wherein said photoelectron emitting part is located at a position at which the incident light from said light source enters and from which the emitted electrons move to said second electrode.

2. The electromagnetic wave generation apparatus according to claim 1,
    wherein a concavity is provided between said first electrode and said second electrode in said surface of said substrate.

3. The electromagnetic wave generation apparatus according to claim 1,
    wherein said photoelectron emitting part comprises a carbon nanotube.

4. The electromagnetic wave generation apparatus according to claim 1,
    wherein said photoelectron emitting part comprises $Al_{1-x-y}In_xGa_yN$, where 0.x.1, 0.y.1.

5. The electromagnetic wave generation apparatus according to claim 1, further comprising
    a mirror that is provided on said surface of said substrate and that guides the incident light from said light source towards said photoelectron emitting part.

6. The electromagnetic wave generation apparatus according to claim 1,
    wherein said photoelectron emitting part includes a plane, said second electrode comprises a plane, a relationship of $D \sin \theta \leqq 0.1$ is satisfied when $\theta$ is an angle formed by said plane of the photoelectron emitting part and a counter plane of said second electrode, L is the shortest distance between said plane of the photoelectron emitting part and said second electrode, and wherein D is the length of said plane of said photoelectron emitting part, measured in a direction from said first electrode to said second electrode.

* * * * *